United States Patent
Fasoli et al.

(10) Patent No.: US 6,807,119 B2
(45) Date of Patent: Oct. 19, 2004

(54) ARRAY CONTAINING CHARGE STORAGE AND DUMMY TRANSISTORS AND METHOD OF OPERATING THE ARRAY

(75) Inventors: Luca Fasoli, San Jose, CA (US); Alper Ilkbahar, San Jose, CA (US); Roy Scheuerlein, Cupertino, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 141 days.

(21) Appl. No.: 10/325,737

(22) Filed: Dec. 23, 2002

(65) Prior Publication Data

US 2004/0120186 A1 Jun. 24, 2004

(51) Int. Cl.$^7$ ................................................ G11C 7/00
(52) U.S. Cl. ................ 365/210; 365/185.11; 365/185.2
(58) Field of Search .......................... 365/210, 185.11, 365/185.2, 185.29

(56) References Cited

U.S. PATENT DOCUMENTS

| | | | |
|---|---|---|---|
| 4,281,397 A | 7/1981 | Neal et al. | |
| 5,306,935 A | 4/1994 | Esquivel et al. | |
| 5,562,308 A | * 10/1996 | Kamei et al. | ................ 280/788 |
| 5,991,202 A | 11/1999 | Derhacobian et al. | |
| 6,185,122 B1 | 2/2001 | Johnson et al. | |
| 6,249,454 B1 | 6/2001 | Sung et al. | |
| 6,258,668 B1 | 7/2001 | Lee et al. | |
| 6,327,182 B1 | 12/2001 | Shum et al. | |
| 6,486,066 B2 | 11/2002 | Cleeves et al. | |
| 6,631,089 B1 | * 10/2003 | Ogura et al. | ........... 365/185.23 |
| 2001/0055838 A1 | 12/2001 | Walker et al. | |
| 2002/0028541 A1 | 3/2002 | Lee et al. | |
| 2002/0142546 A1 | 10/2002 | Kouznetsov et al. | |

OTHER PUBLICATIONS

Institute of Electrical and Electronics Engineering, 2001 Digest of Technical Papers, vol. Forty–Four, ISSN 01CH37177, pp. 423–424.

An Asymmetrical Lightly Doped Source Cell for Virtual Ground High–Density EPROM's Kuniyoshi Yoshikawa, Member, IEEE, IEEE Transactions on Electron Devices, vol. 37, No. 4, Apr. 1990.

* cited by examiner

*Primary Examiner*—Vu A. Le
(74) *Attorney, Agent, or Firm*—Foley & Lardner LLP

(57) ABSTRACT

An array of transistors includes a plurality of charge storage transistors and a plurality of dummy transistors interspersed with the plurality of charge storage transistors. Each of the plurality of the dummy transistors is made using the same photolithographic masking steps as each of the plurality of the charge storage transistors. A method of operating the array includes programming and/or erasing the array of transistors, and reading the plurality of charge storage transistors but not the plurality of dummy transistors.

43 Claims, 16 Drawing Sheets

ARRAY CONTAINING CHARGE STORAGE AND DUMMY TRANSISTORS AND METHOD OF OPERATING THE ARRAY

FIELD OF THE INVENTION

The present invention is directed generally to semiconductor devices and methods of fabrication and more particularly to an array of charge storage transistor array and method of operation.

BACKGROUND OF THE INVENTION

Charge storage transistors are transistors which contain a charge storage region. These transistors may be used in memory devices, such as in electrically erasable programmable memories (EEPROM). The charge storage transistors may be programmed by Fowler-Nordheim (FN) tunneling or by channel hot electron (CHE) injection.

BRIEF SUMMARY OF THE INVENTION

A preferred embodiment of the present invention provides a method of operating an array of transistors, comprising providing the array of transistors, comprising a plurality of charge storage transistors, and a plurality of dummy transistors interspersed with the plurality of charge storage transistors. Each of the plurality of the dummy transistors is made using same photolithographic masking steps as each of the plurality of the charge storage transistors. The method further comprises at least one of programming and erasing the array of transistors, and reading the plurality of charge storage transistors but not the plurality of dummy transistors of the array of transistors.

Another preferred embodiment of the present invention provides a semiconductor device, comprising an array of transistors comprising a plurality of charge storage transistors, and a plurality of dummy transistors interspersed with the plurality of charge storage transistors. Each of the plurality of the dummy transistors is made using same photolithographic masking steps as each of the plurality of the charge storage transistors. The device further comprises a first means for (i) at least one of programming and erasing the array of transistors, and (ii) reading the plurality of charge storage transistors but not the plurality of dummy transistors of the array of transistors.

Another preferred embodiment of the present invention provides a semiconductor device, comprising an array of transistors comprising a plurality of charge storage transistors, and a plurality of dummy transistors interspersed with the plurality of charge storage transistors. Each of the plurality of the dummy transistors is made using same photolithographic masking steps as each of the plurality of the charge storage transistors. The device further comprises a peripheral programming circuitry operable to (i) at least one of program and erase the array of transistors, and (ii) read the plurality of charge storage transistors but not the plurality of dummy transistors of the array of transistors.

DETAILED DESCRIPTION OF THE PREFERRED EMBODIMENTS

Figure 1:
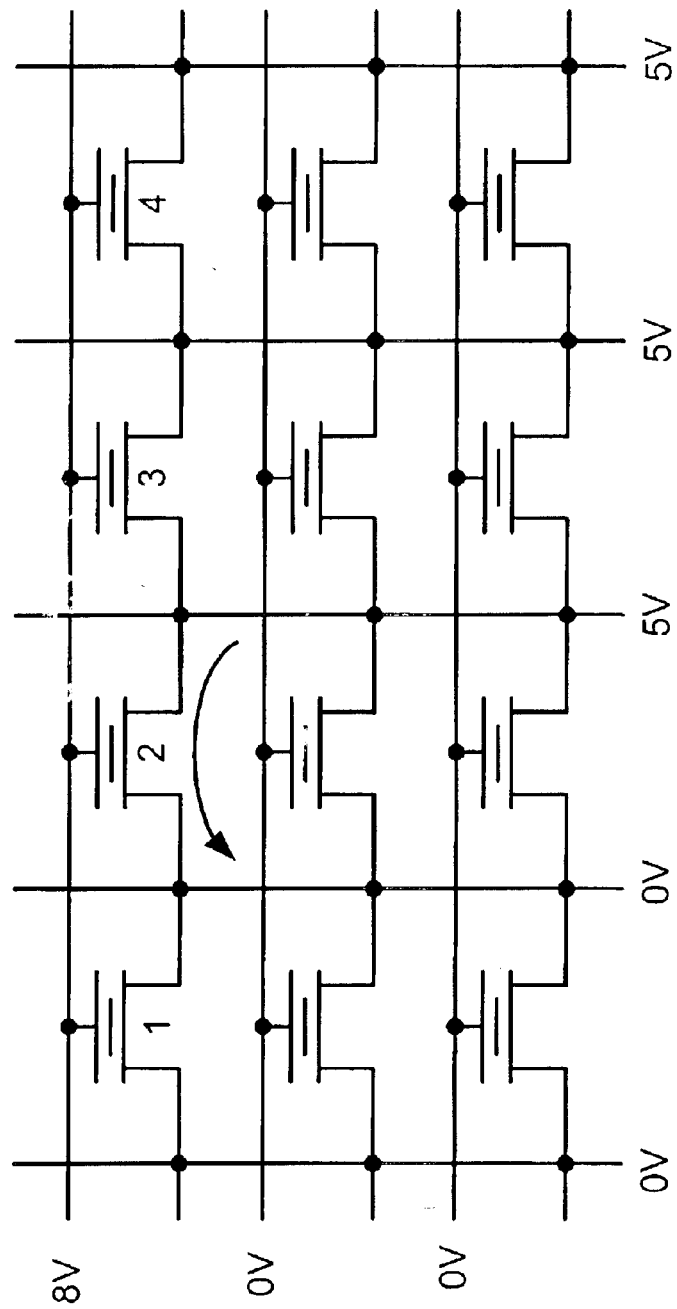
FIGS. 1 and 2 are circuit schematics of prior art arrays.

U.S. published application 20020028541 which was filed as U.S. application Ser. No. 09/927,648, on Aug. 13, 2001 and which is incorporated by reference in its entirety, discloses a monolithic three dimensional array of charge storage transistors. In one embodiment of this application, the transistors are programmed by Channel Hot Electron (CHE) injection. The charge storage transistors that are programmed by CHE injection may be arranged in a virtual ground array (VGA), in which adjacent charge storage transistors 1, 2, 3, 4 share common bit lines, as illustrated in FIG. 1. In CHE injection programming, a voltage is placed between a source and a drain of a charge storage transistor. The hot electrons travelling through the channel of the transistor between the source and the drain are injected into the charge storage region of the transistor which is disposed adjacent to the channel. For example, FIG. 1 illustrates charge storage transistor 2 being programmed by CHE injection when 8V is applied to its word line, 0V is applied to its source bit line and 5V is applied to its drain bit line. All other transistors are biased so that no current flows through them. However, if the charge storage transistors of the VGA are thin film transistors with polysilicon channel regions, then the quality of CHE injection programming is lower than desirable.

Figure 2:
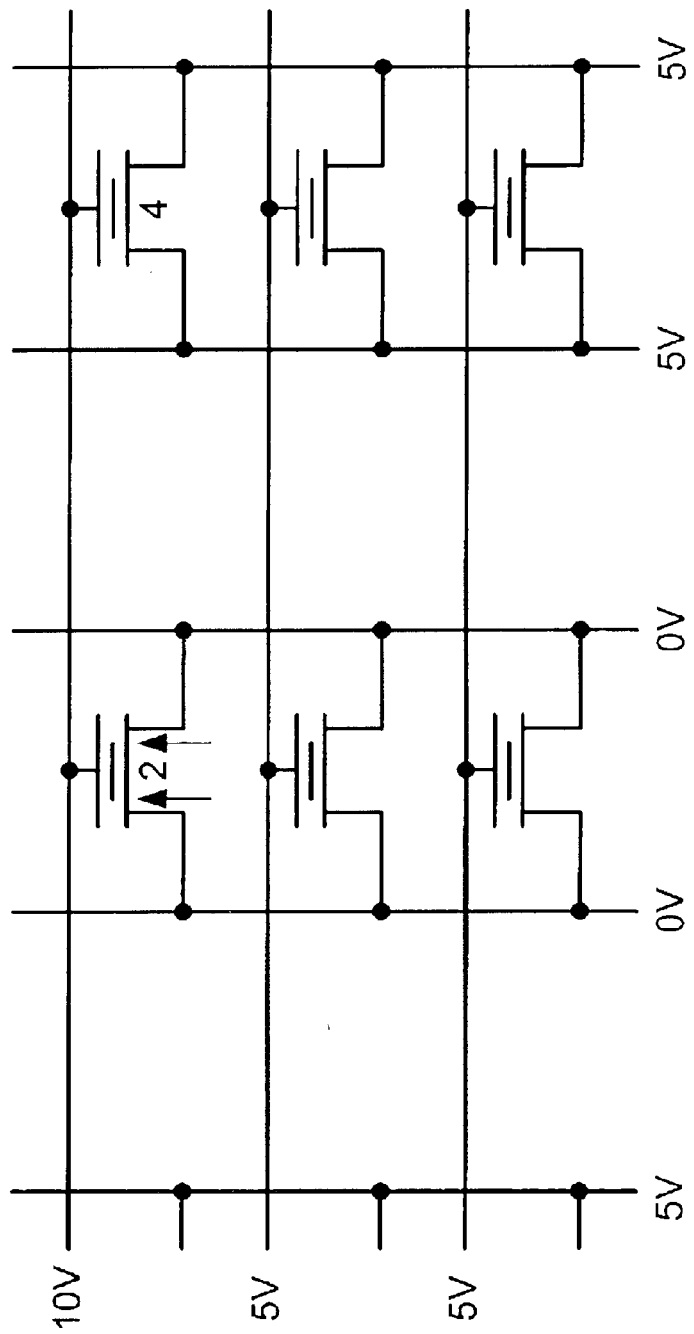

In another embodiment shown in FIGS. 83A to 85 of U.S. published application 20020028541, the charge storage transistors are programmed by Fowler-Nordheim (FN) tunneling. In FN tunneling programming, a voltage is applied between a word line and a source or a drain bit line of a charge storage transistor. For example, FIG. 2 illustrates charge storage transistor 2 being programmed by FN tunneling when 10V is applied to its word line and 0V is applied to its bit lines. All other transistors are biased so that no current flows through them. Higher quality thin film transistor programming may be achieved by using FN tunneling programming instead of CHE injection programming.

However, as described in paragraph [0330] of this published application, the active region of each transistor is located in a discrete island to allow these transistors to be programmed by FN tunneling. Thus, an extra photolithographic patterning step is added to pattern a common polysilicon active layer into discrete active region islands. Isolation regions are located between the active region islands of each charge storage transistor. Without the isolation regions, the transistor adjacent to a programmed transistor would also be unintentionally programmed (i.e., a parasitic programmed transistor would be formed). Thus, isolation regions allow the charge storage transistors to be programmed by FN tunneling without creating parasitic transistors, but increase the array fabrication complexity and cost.

The present inventors have realized that the extra photolithographic patterning step of the active layer may be eliminated by using a biasing scheme in which some transistors in the array act as dummy transistors which are not read during a reading operation. Thus, an array of charge storage and dummy transistors can be programmed by FN tunneling without forming isolation regions between charge storage transistors because the dummy transistors isolate the charge storage transistors from each other. Thus, no extra processing steps are required to remove the parasitic transistors, which reduces the cost and complexity of fabricating the array.

Figure 3:
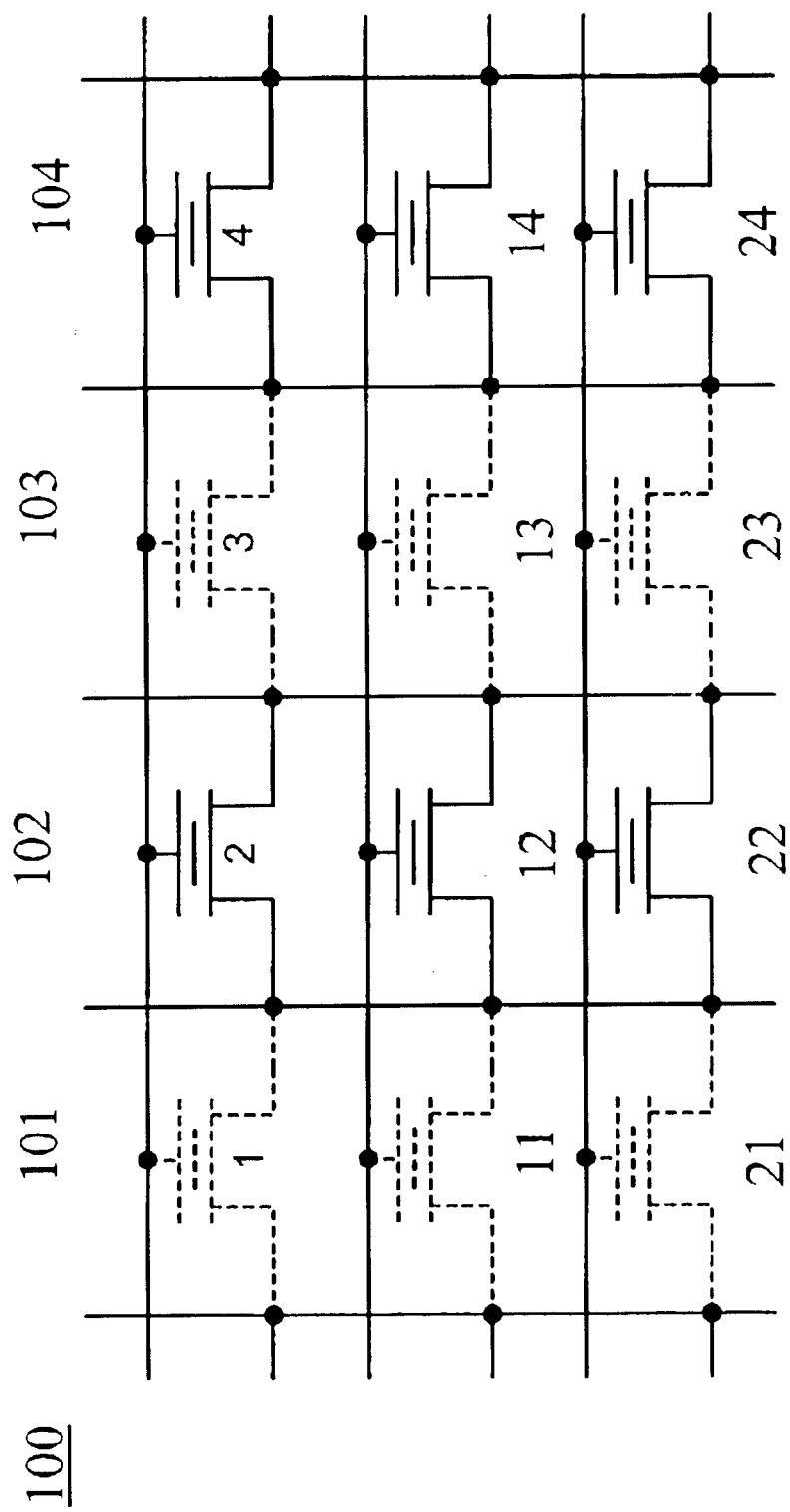
FIGS. 3 and 6–10 are circuit schematics of an array according to the first preferred embodiment of the present invention.

FIG. 3 illustrates a circuit schematic of an array of transistors 100 according to the first preferred embodiment of the present invention. The array includes a plurality of charge storage transistors shown by solid lines and a plurality of dummy transistors shown by dashed lines. For example, in array 100, the charge storage transistors are numbered 2, 4, 12, 14, 22 and 24 and the dummy transistors are numbered 1, 3, 11, 13, 21 and 23. As shown in FIG. 3, the dummy transistors are interspersed with the plurality of charge storage transistors. Each of the plurality of charge storage transistors, such as transistor 2, is located between two of the plurality of dummy transistors, such as transistors 1 and 3. Each of the plurality of charge storage transistors, such as transistor 2, shares one bit line with one of the two dummy transistors 1 and shares another bit line with another one of the two dummy transistors 3.

The array 100 is erased and/or programmed by FN tunneling. As used herein, the term "program" means raising a threshold voltage of one or more transistors, and the term "erase" means lowering the threshold voltage of one or more transistors. During the programming and erasing steps, at least one charge storage transistor is programmed and erased. Then, one or more of the charge storage transistors are read during a reading step. However, the dummy transistors are not read during the reading step. The dummy transistors may be intentionally or unintentionally programmed or not programmed during a programming step. Likewise, the dummy transistors may be intentionally or unintentionally erased or not erased during an erasing step. However, even if the dummy transistors are intentionally or unintentionally programmed or erased during the respective programming or the erasing step, these dummy transistors act as isolation regions between the charge storage transistors because the dummy transistors are not read. In other words, since the dummy transistors do not participate in the read out of the used cells of the array, it does not matter if their threshold voltage was or was not changed during a programming or erasing step. The array 100 may be configured to be a "write many" or a "write once" array. A "write many" array may be programmed and erased many times by the manufacturer and/or by the user. A "write once" array is programmed or erased only once by the manufacturer or the end user.

The array 100 comprises a plurality of columns 101, 102, 103 and 104 of transistors. The plurality of charge storage transistors 2, 4, 12, 14, 22 and 24 are located in a first group of columns 102, 104. The plurality of dummy transistors 1, 3, 11, 13, 21 and 23 are located in a second group of columns 101, 103. In other words, the charge storage transistors are located in a first out of every two columns and the dummy transistors are located in a second out of every two columns. During a reading operation, only the first group of columns 102, 104 and not the second group of columns 101, 103 are read. Thus, transistors in column 103 isolate transistors in column 102 from transistors in column 104.

Figure 4:
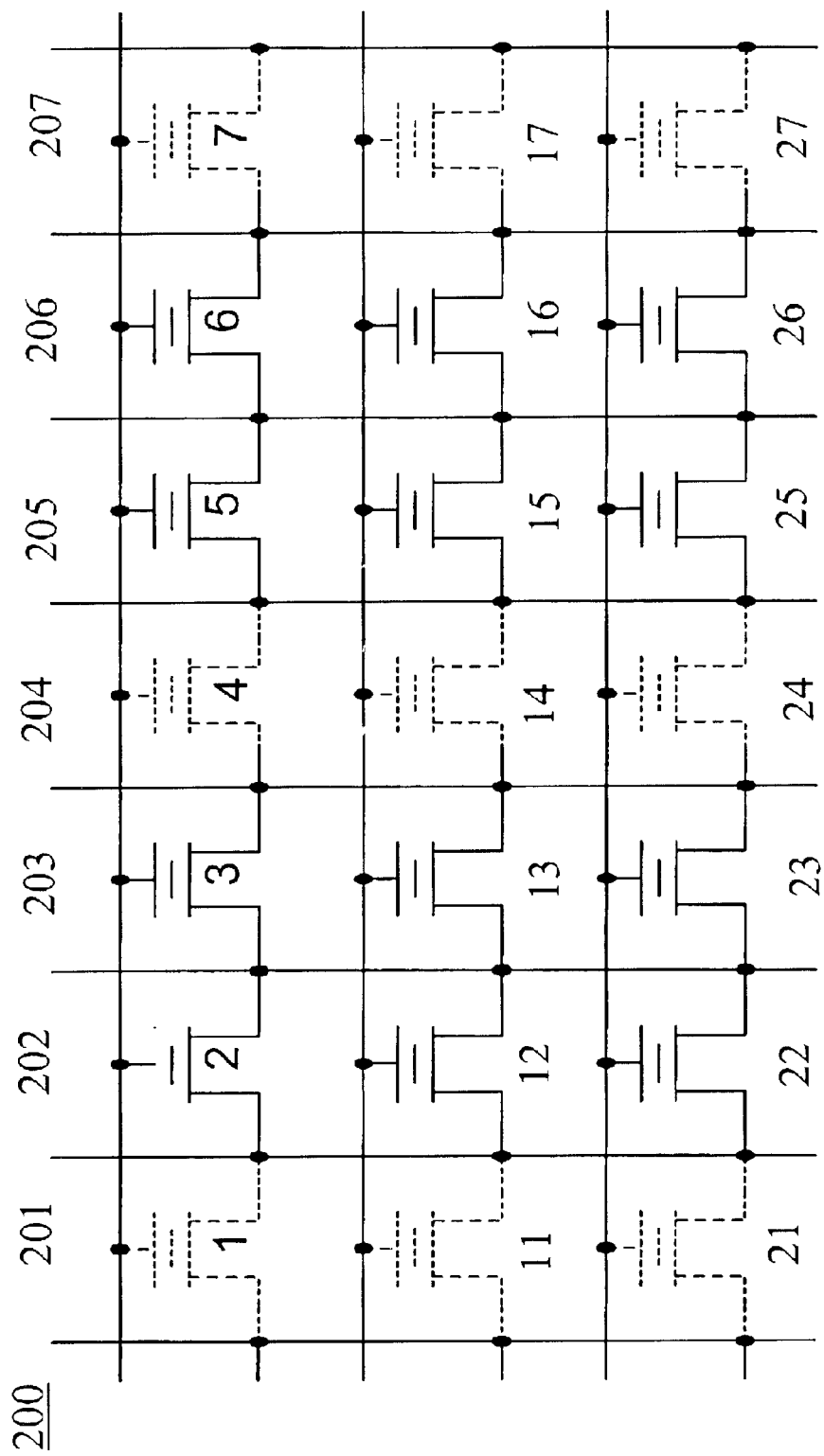
FIGS. 4 and 11–15 are circuit schematics of an array according to the second preferred embodiment of the present invention.

FIG. 4 illustrates an array 200 according to the second preferred embodiment of the present invention. In the array 200, the charge storage transistors are located in first and second columns out of every three columns of the array. The dummy transistors are located in a third out of every three columns of the array.

For example, the plurality of charge storage transistors 2, 3, 5, 6, 12, 13, 15, 16, 22, 23, 25 and 26 are located in a first group of columns 202, 203, 205, 206. The plurality of dummy transistors 1, 4, 7, 11, 14, 17, 21, 24 and 27 are located in a second group of columns 201, 204 and 207. Thus, transistors in column 204 isolate transistors in column 203 from transistors in column 205. Transistors in columns 202 and 203 share a common bit line and transistors in columns 205 and 206 also share a common bit line. Each of the plurality of dummy transistors, such as transistor 4, is located between two of the plurality of charge storage transistors, such as transistors 3 and 5. Each of the plurality of charge storage transistors, such as transistor 3, shares a bit line with an adjacent one of the plurality of dummy transistors, such as transistor 4, and shares another bit line with an adjacent one of the plurality of charge storage transistors, such as transistor 2.

The array 200 is also programmed and/or erased by FN tunneling. Then, one or more of the charge storage transistors are read during a reading step. However, the dummy transistors are not read during the reading step. It should be noted that the present invention is not limited by the preferred array 100, 200 layouts. Other suitable array layouts may also be used.

In the arrays 100, 200 of the preferred embodiments of the present invention, each of the plurality of the dummy transistors is made using same photolithographic masking steps as each of the plurality of the charge storage transistors. Thus, each dummy transistor is formed at the same time as each charge storage transistor. For example, the same photoresist or other masking layers are used as a mask during the etching of the corresponding layers of the dummy and the charge storage transistors. Thus, each corresponding layer of the dummy and the charge storage transistors is etched during the same etching step, as will be described in more detail below.

In one preferred aspect of the first and second embodiments, each dummy transistor has an identical structure to each charge storage transistor. Thus, the dimensions of each feature of each dummy transistor are the same as the corresponding dimensions of each charge storage transistor. For example, each dummy and charge storage transistor may have the same source to drain spacing, the same gate width, the same gate thickness and the same channel thickness.

In an alternative aspect of the first and second embodiments, each dummy transistor has different dimensions than each charge storage transistor, even though the dummy transistors and the charge storage transistors are made using the same photolithographic masking steps. This may be accomplished by using different mask dimensions in the dummy transistor regions than in the charge storage transistor regions. For example, a photoresist layer may be patterned such that wider or narrower portions of the patterned photoresist layer remain in the dummy transistor portions than in the charge storage transistor portions of the array. When the dummy and the charge storage transistor layers are etched using the patterned photoresist layer, the width of the dummy transistor features may be wider or narrower than the corresponding feature of the charge storage transistors. For example, the dummy transistor source to drain spacing and gate width may be larger or smaller than the corresponding spacing and width of the charge storage transistors.

In one preferred aspect of the first and second embodiments, the dummy transistors comprise dedicated dummy transistors and the charge storage transistors comprise dedicated charge storage transistors. This means that during the lifetime of the array, certain transistors are never read out. These transistors are the dummy transistors. Other transistors are adapted to be read out during the read operations. These transistors are the dedicated charge storage transistors.

In another alternative aspect of the first and second embodiment, the dummy and charge storage transistors comprise undedicated transistors. This means that any given transistor in the array may be used as a charge storage transistor and read out during one reading operation, and then used as a dummy transistor and not read out during another reading operation. For example, transistor 3 may be used as a dummy transistor if its column is not read during a reading operation in array configuration 100 illustrated in FIG. 3. Later, the same transistor 3 may be used as a charge storage transistor if its column is read during a reading operation in array configuration 200 illustrated in FIG. 4. Thus, the same array of transistors may be used in array configuration 100 and/or 200 depending on which array columns are read during a reading operation.

The individual transistors of the arrays 100, 200 may be selectively programmed, read and erased (i.e., individually and in sequence). Thus, during a selective programming or erasing step, some or all charge storage transistors are programmed or erased. The dummy transistors may be affected or not affected by the selective programming or erasing step. Thus, the dummy transistors may be programmed or not programmed during a selective programming step and the dummy transistors may be erased or not erased during a selective erasing step. Alternatively, the transistors of the arrays 100, 200 may be simultaneously programmed and/or erased in blocks similar to commercial flash memory devices. A block of transistors may comprise any desired number of charge storage transistors and dummy transistors adjacently located in one or more rows in the array. The block operations allow a reduction in many of the disturb conditions. Also, during a block operation, no current will flow, since all bit lines are biased at the same voltage.

Since both program and erase operations could be made selective or block, the transistors may be selectively programmed and block erased in either order, or a selectively erased and block programmed in either order. A selective program and a block erase allows a faster selective operation, but there will be current flowing during programming, thus increasing operating power. In contrast, a selective erase and a block program will provide a slower selective operation, but at a lower operating power level. Depending on the desired application, faster selective operation could be provided at the expense of higher operating power or vice versa, by correctly choosing the block operation. If desired, both programming and erase operations may be done selectively or by blocks.

Figure 5:
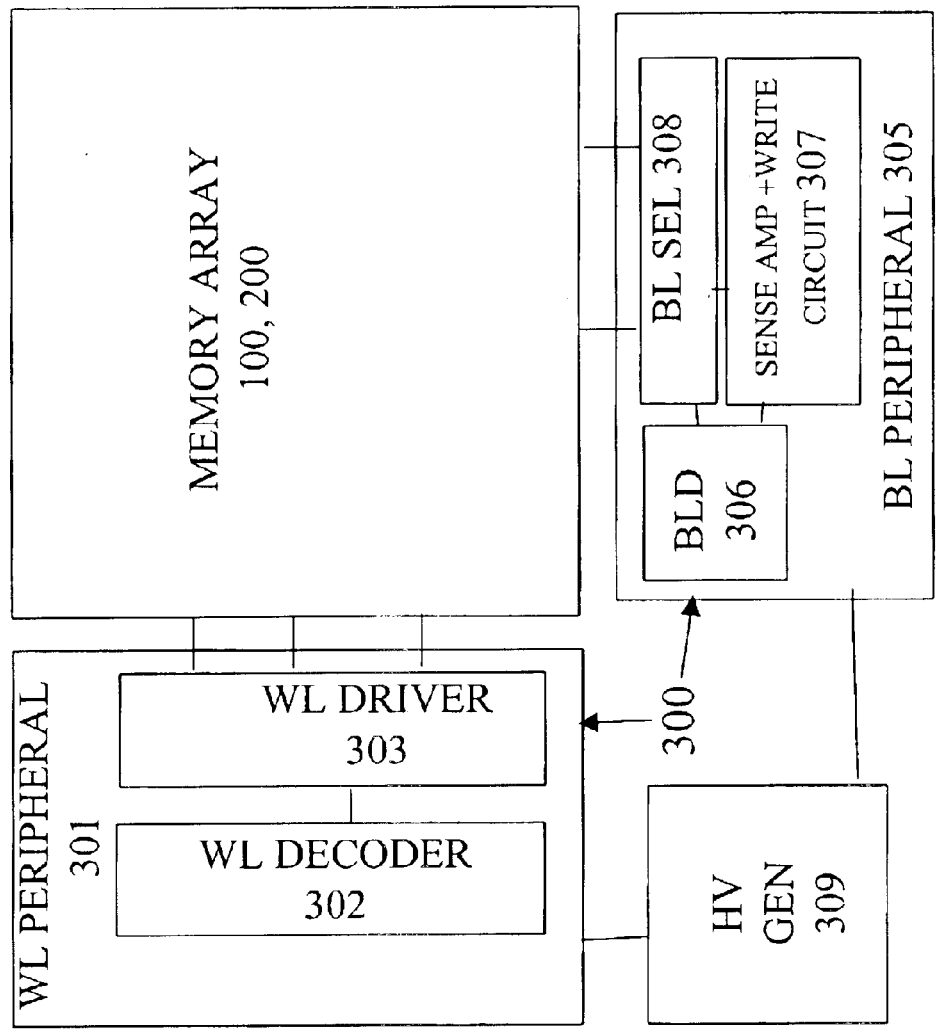
FIG. 5 is a circuit schematic of a device according to the preferred embodiments of the present invention.

The program, erase and read biasing operations on arrays 100, 200 of the preferred embodiments of the present invention are performed by peripheral programming circuitry, which is also known as driver circuitry. Preferably, the peripheral programming circuitry is located on or over the same substrate as the arrays 100 or 200. For example, FIG. 5 illustrates an example of a semiconductor memory device containing the memory array 100, 200 and peripheral programming circuitry 300. The peripheral programming circuitry 300 is used to program and erase the transistors in the array of transistors, and to read the charge storage transistors but not the dummy transistors in the array 100, 200.

The peripheral programming circuitry 300 may contain any suitable circuit blocks. For example, circuitry 300 may comprise a word line peripheral circuit 301 and a bit line peripheral circuit 305, as shown in FIG. 5. The word line peripheral circuit 301 is used to bias the word lines of the arrays 100, 200 and may include a word line decoder circuit 302 and a word line (i.e., row) driver or selector circuit 303. The bit line peripheral circuit 305 is used to bias the bit lines of the arrays 100, 200 and may include a bit line (i.e., column) decoder circuit 306, a sense amp circuit 307 and a bit line (i.e., column) selector circuit 308. Other suitable circuit elements may be used instead of or in addition to the above elements. Each circuit element preferably comprises complementary metal oxide semiconductor (CMOS) logic circuit.

The examples below illustrate preferred biasing conditions for program, erase and read operation for the arrays 100, 200. It should be noted that the biasing schemes described herein are only preferred examples. Different product performance requirements will dictate which tradeoffs need to be made in choosing the appropriate biasing conditions. Table I summarizes the nomenclature used to describe the biasing conditions.

TABLE I

| | |
|---|---|
| VGsel | Gate voltage for the selected transistor |
| VDsel | Bit line (drain) voltage for the selected transistor |
| VSsel | Bit line (source) voltage for the selected transistor |
| VGunsel | Gate voltage for unselected transistors |
| VBunsel | Bit line voltage for unselected transistors |

The biasing conditions for the array 100 configuration of the first preferred embodiment will now be described. To program a selected transistor of the array 100, a high programming voltage, VPP, is applied to the selected word line of the selected charge storage transistor. The selected source and drain bit lines are grounded or biased to a negative voltage to program the selected transistor using FN tunneling.

While programming one or more selected transistors (i.e., cells), many other transistors on the selected word line are not to be programmed. All unselected bit lines are biased at the bit line programming inhibiting voltage, VPinhbtb. All unselected word lines are biased at a word line programming inhibiting voltage, VPinhbtg, so transistors on these word lines are not programmed. As used herein, Vpinhbtg and VPinhbtb may have the same or different magnitude. The magnitude of the bit line and word line programming inhibiting voltages are lower than the magnitude of the programming voltage. The magnitude of the programming inhibiting voltages are selected to inhibit programming of the unselected transistors. The magnitude of the programming inhibiting voltages are greater than the magnitude of the selected bit line voltage.

Table II summarizes the biasing condition for the programming operation on the array 100. It should be noted that the voltages provided in Table II are preferred examples and should be not considered limiting on the scope of the invention.

TABLE II

| | |
|---|---|
| VGsel | VPP 10–14 V, preferably 12 V |
| VDsel/VSsel | 0 V |
| VGunsel | VPinhbtg 4–6 V, preferably 5 V |
| VBunsel | VPinhbtb 4–6 V, preferably 5 V |

Figure 6:
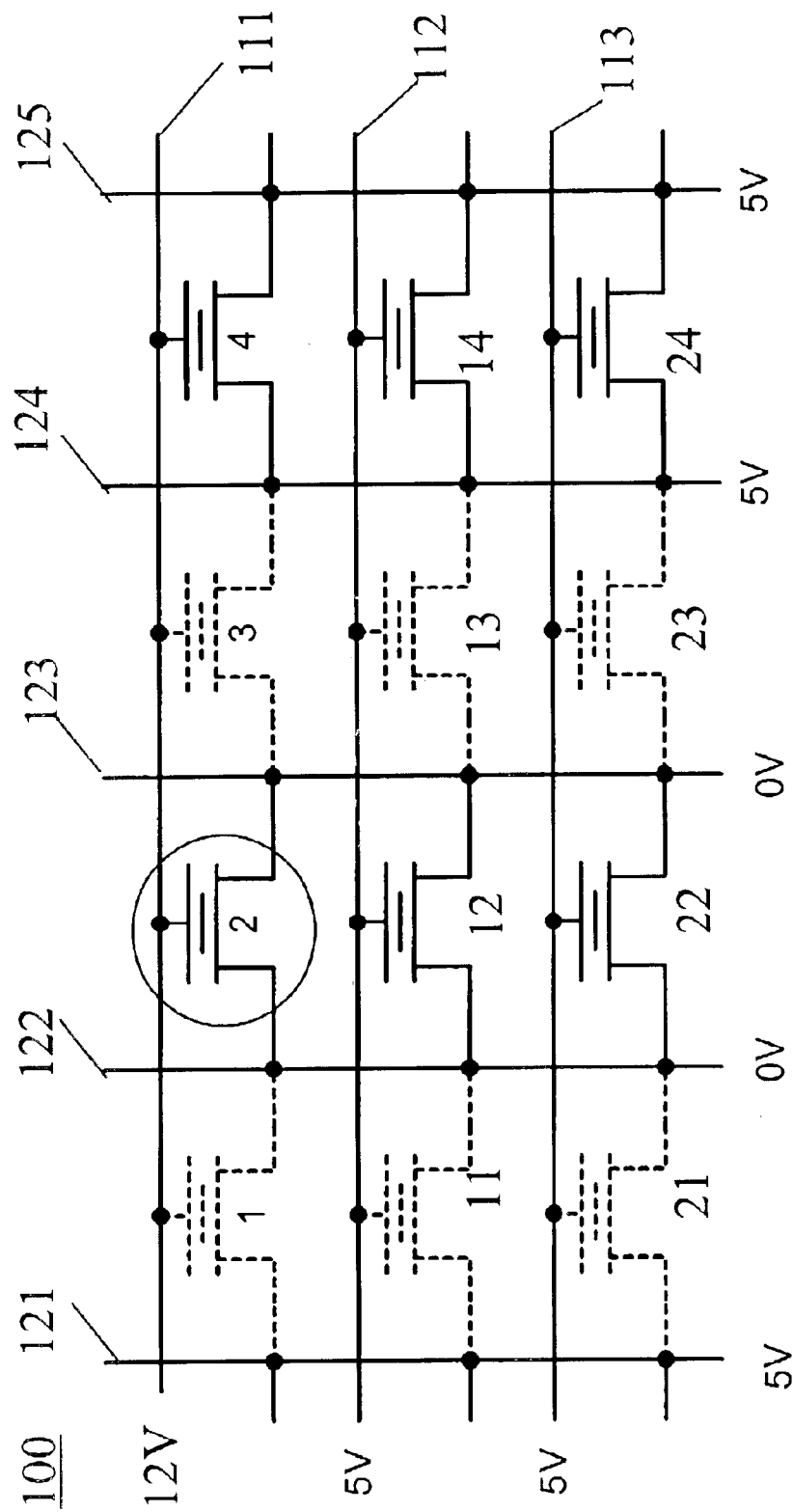

An example of programming a selected charge storage transistor 2 is illustrated in FIG. 6. The 12V programming voltage is applied to a selected first word line 111 of the selected charge storage transistor 2. The selected source 122 and drain 123 bit lines of transistor 2 are preferably grounded, but may be biased to a negative voltage, if desired. The 5V programming inhibiting voltage is applied to unselected word lines 112, 113 and to unselected bit lines 121, 124, 125 of a first set of unselected charge storage and dummy transistors 1, 3, 4, 11–14 and 21–24.

In this biasing scheme, all charge storage transistors 4 on the selected word line 111 that are not to be programmed will have a gate-to-bit line voltage of VPP-VPinhbtb, which is low enough not to disturb unprogrammed transistors. All unselected charge storage transistors 12, 22 sharing the same source 122 and drain 123 bit lines with the selected transistor 2 will be biased at a gate-to-bit line voltage of VPinhbtb, which will not disturb unprogrammed transistors. Finally, all other charge storage transistors 14, 24 will be biased with a gate-to-bit line voltage of VPinhbtg-VPinhbtb, which is very low and will not create any program or erase disturb.

It should be noted that the dummy transistors have a different bias condition that could modify their thresholds, but since they will never participate in the read out operation of the charge storage transistors (i.e., the used cells), this effect will not influence the array performance. The adjacent dummy transistors 1, 3 sharing a bit line and a word line with the selected charge storage transistor 2 will have a drain-to-source voltage different than zero (i.e., 5V in the example of FIG. 6). If this gate-to-source voltage is above the threshold voltage of these dummy transistors, then leakage current will flow through these adjacent dummy transistors 1, 3. In order to limit this leakage current, the VPinhbtg voltage on the unselected word lines 112, 113 should also be limited or a block program and a selective erase operation should be used, as will be described below.

To erase a selected transistor of the array 100, zero volts or a negative voltage is applied to its word line (i.e., gate). A high erase voltage, VEE, is applied to the source and drain bit lines of the selected transistor. Preferably, VEE is lower than VPP. A bit line erase inhibiting voltage, VEinhbtb, is applied to the bit lines of the unselected transistors. The bit line erase inhibiting voltage is lower than the erase voltage. The magnitude of the bit line erase inhibiting voltage is selected to inhibit erasing of at least the unselected charge storage transistors. All word lines except for the word line of the selected transistor are biased at the word line erase inhibiting voltage, VEinhbtg. As used herein, VEinhbtg and VEinhbtb may have the same or different magnitude.

Table III summarizes the biasing condition for the erase operation on the array 100. It should be noted that the voltages provided in Table III are preferred examples and should be not considered limiting on the scope of the invention.

TABLE III

| | |
|---|---|
| VGsel | 0 V |
| VSsel/VDsel | VEE 8–12 V, preferably 10 V |
| VGunsel | VEinhbtg 4–6 V, preferably 5 V |
| VBunsel | VEinhbtb 4–6 V, preferably 5 V |

Figure 7:
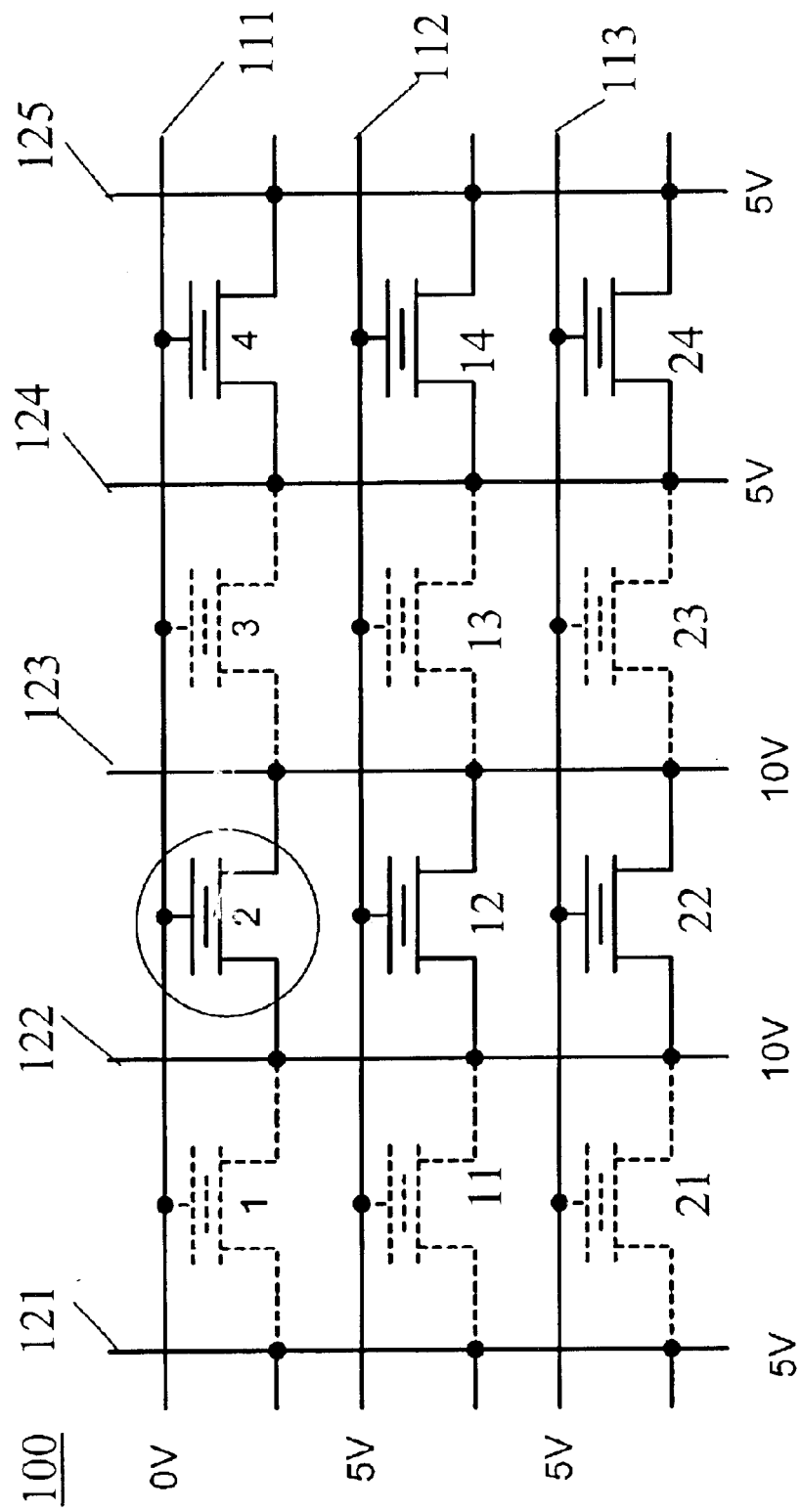

An example of erasing a selected charge storage transistor 2 is illustrated in FIG. 7. The selected first word line 111 of the selected charge storage transistor 2 is preferably grounded, or may be biased to a negative voltage instead. The 10V erase voltage is applied to the selected source 122 and drain 123 bit lines of the selected charge storage transistor 2. The 5V erase inhibiting voltage is applied to the unselected word lines 112, 113 and to the-unselected bit lines 121, 124, 125 of the first set of unselected charge storage and dummy transistors 1, 3, 4, 11–14 and 21–24.

In this biasing scheme, all charge storage transistors 4 on the selected word line 111 will have a gate-to-bit line voltage of –VEinhbtb, which is low enough not to disturb programmed transistors. All unselected charge storage transistors 12, 22 sharing the same source 122 and drain 123 bit lines with the selected transistor 2 will be biased at a gate-to-bit line voltage of VEE–VEinhbtb, which will not disturb programmed cells. Finally, all other unselected charge storage transistors 14, 24 will be biased with a gate-to-bit line of VEinhbtg–VEinhbtb, which is very low and will not create any program or erase disturb.

Even if dummy transistors 1, 3 have a drain to source voltage greater than 0, since their gate-to-source voltage is always equal or less than 0, the current flowing through transistors 1, 3 is greatly reduced with respect to the program operation. This feature may be used to reduce the operational current with the block operations described in detail below.

To read the selected transistors of array 100, the word line of the selected transistor is raised to an appropriate gate read voltage, VRDG, while the drain and source bit lines are biased to drain and source read voltages, VRDD and VRDS, respectively. The exact values of these voltages depend on the device characteristics and their statistical distribution. For example, for NMOS transistors, the source is maintained at a lower potential than the drain, and the current flows from drain to source. In contrast, for PMOS transistors, the drain is maintained at a lower potential than the source, and the current flows from source to drain. Thus, for NMOS transistors, preferably, VRDG is about 1.5 to 3V, such as 2V, VRDD is about 1.5 to 2.5V, such as 2V and VRDS is about 0.4 to 0.6V, such as 0.5V. Thus, the VRDS magnitude is lower than that of VRDD for NMOS transistors. However, the VRDS magnitude is higher than that of VRDD if PMOS transistors are used. Thus, VRDD is different from VRDS. In the following description, the arrays of NMOS transistors according to a preferred aspect of the present invention will be described. However, arrays of PMOS transistors may also be formed instead if desired.

The read operation is performed by sensing a current on the drain or the source terminal of the selected transistor. All unselected word lines are preferably grounded, but may be biased to a small reference voltage instead. If the selected charge storage transistor is read by measuring the current on the selected source bit line, then at least one unselected bit line located adjacent to the selected source bit line of the selected charge storage transistor is precharged to the source read voltage, VRDS, before the reading operation. Alternatively, if the selected charge storage transistor is read by measuring the current on the selected drain bit line, then at least one unselected bit line located adjacent to the selected drain bit line of the selected charge storage transistor is precharged to the drain read voltage, VRDD, before the reading operation. Thus, at least the nearest unselected bit line to the selected source or drain bit line which will be read, is precharged to VRDS or VRDD, respectively to avoid a leakage current. Preferably, all unselected bit lines are allowed to float, except for the bit lines located adjacent to the selected bit lines. Alternatively, all unselected bit lines on the source bit line side of the selected transistor are precharged to VRDS and all unselected bit lines on the drain bit line side of the selected transistor are precharged to VRDD. During the read operation, the precharged bit line(s) may be maintained at VRDD and/or VRDS, respectively, or are allowed to float.

Table IV summarizes the biasing condition for the read operation on the array 100. It should be noted that the voltages provided in Table IV are preferred examples and should be not considered limiting on the scope of the invention.

TABLE IV

| VGsel | VRDG |
|---|---|
| VSsel/VDsel | VRDS/VRDD |
| VGunsel | 0 V |
| VBunsel | Precharge to VRDS and/or VRDD and/or Float |

Figure 8:
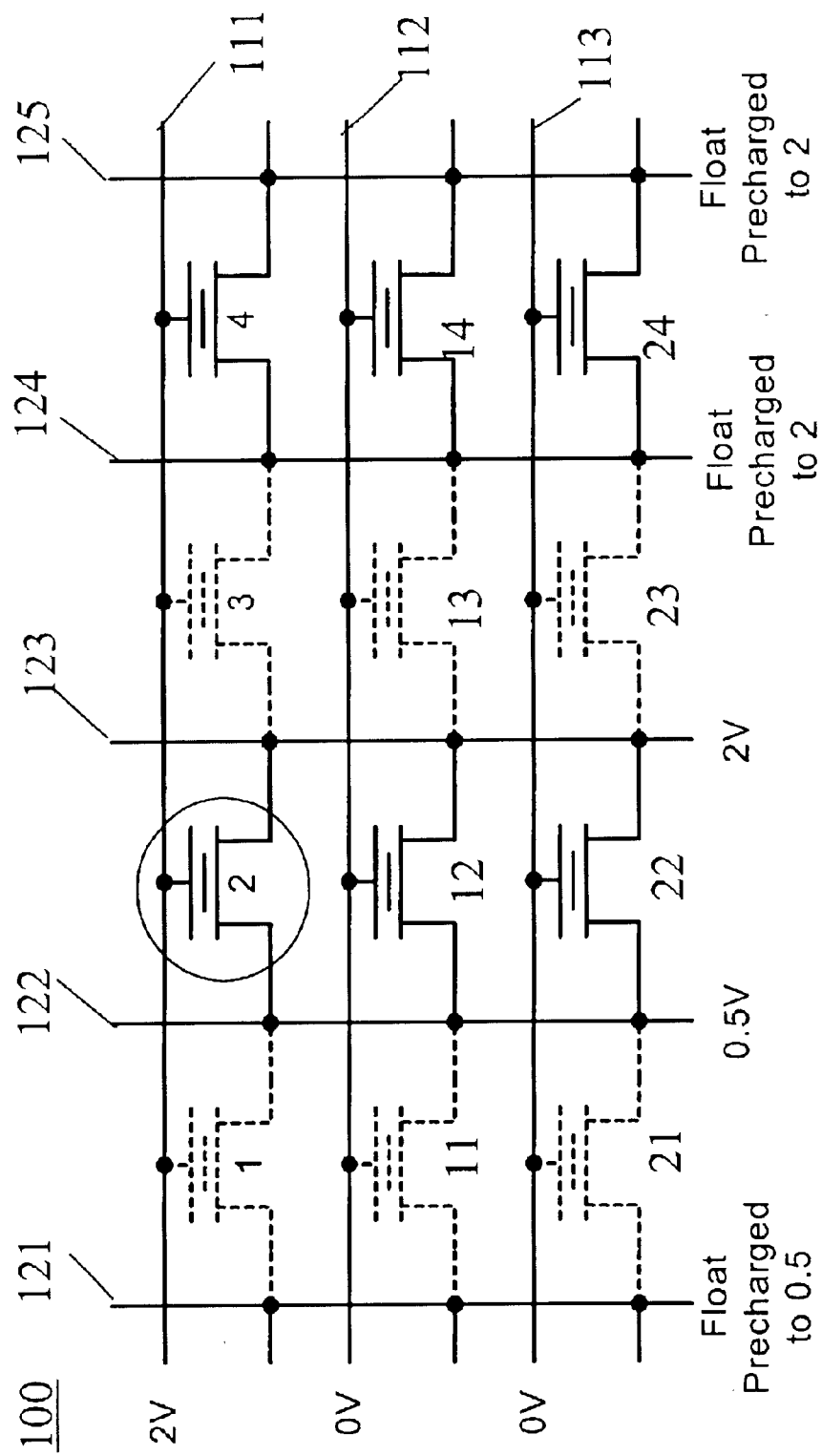

An example of reading a selected charge storage transistor 2 is illustrated in FIG. 8. Unselected first bit line(s) 121 of a second subset of unselected transistors 1, 11, 21 is precharged to the 0.5V source read voltage. As shown in FIG. 8, the second subset of unselected transistors 1, 11, 21 is a subset of the first set of unselected transistors 1, 3, 4, 11–14, 21–24. The second subset of unselected transistors 1, 11, 21 is located on a source bit line 122 side of the selected charge storage transistor 2.

Unselected second bit lines 124, 125 of a third subset of unselected transistors 3, 4, 13, 14, 23, 24 are precharged to about the 2V drain read voltage. The term "about the drain read voltage" means a voltage which equals the drain read voltage or which differs from the drain read voltage by an amount less than that which allows a parasitic leakage current to flow. If desired, unselected bit lines 124, 125 do not have to be precharged if transistor 2 is read from the source bit line 122. Alternatively, unselected bit line 125 does not have to be precharged even if transistor 2 is read from the drain bit line 123. The third subset of unselected transistors 3, 4, 13, 14, 23, 24 is a subset of the first set of unselected transistors 1, 3, 4, 11–14, 21–24. The third subset of unselected transistors 3, 4, 13, 14, 23, 24 is located on a drain bit line 123 side of the selected charge storage transistor 2.

The unselected word lines 112, 113 of a fourth subset of unselected transistors 11–14, 21–24 are grounded. The fourth subset of unselected transistors 11–14, 21–24 comprises a subset of the first set of unselected transistors 1, 3, 4, 11–14, 21–24.

The 2V gate read voltage is applied to the selected first word line 111 of the selected charge storage transistor 2. The gate read voltage is lower than the programming voltage.

The 2V drain read voltage is applied to the selected drain bit line 123 of the selected charge storage transistor 2. The 0.5V source read voltage is applied to the selected source bit line 122 of the selected charge storage transistor 2.

The selected charge storage transistor 2 is read by measuring a current on the selected source bit line 122 of the selected charge storage transistor 2. During the step of reading, the unselected first 121 and second 124, 125 bit lines may be allowed to float. Alternatively, the unselected first bit line(s) 121 is maintained at the 0.5V source read voltage, and the unselected second bit lines 124, 125 are maintained at about the 2V drain read voltage during the reading the selected charge storage transistor 2. The plurality of dummy transistors 1, 3, 11, 13, 21, 23 are not read during the step of reading the selected charge storage transistor 2. If desired, transistor 2 can be read from the drain bit line instead.

The dummy transistors do not influence the read operation since they have a drain-to-source voltage close to zero. Having a negative gate-to-source voltage across transistors on the same bit lines as the selected transistor reduces their contributions to the read current, thus allowing a very precise read.

Figure 9:
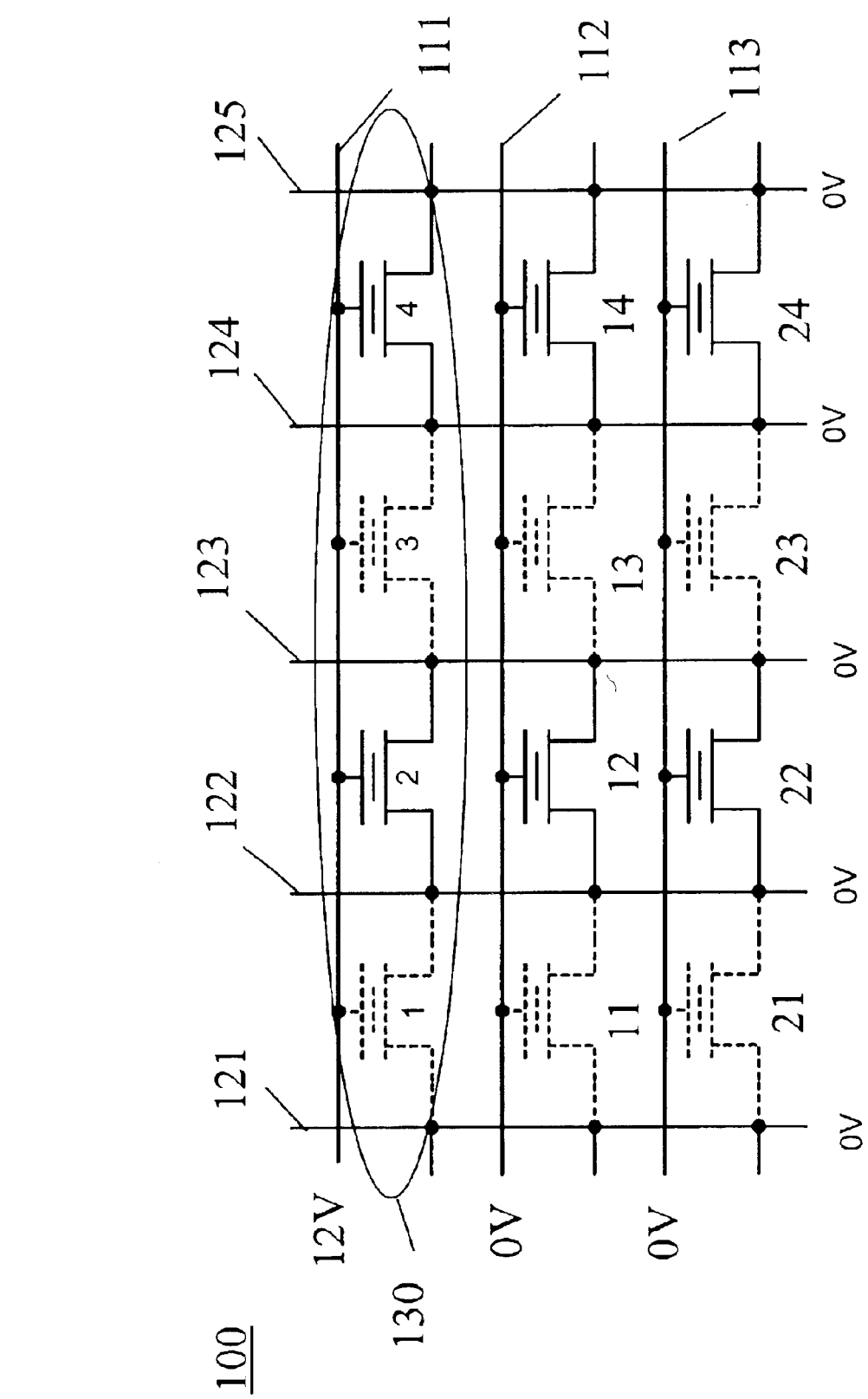

FIG. 9 illustrates a block programming operation, where a first block 130 of selected charge storage transistors 2, 4 and dummy transistors 1, 3 located in a first row of the array 100 is programmed at the same time. Of course a block may also be located in more than one row. The 12V programming voltage is applied to the selected first word line 111 of the first block 130 of selected charge storage and dummy transistors. All bit lines 121–125 of the first block 130 of transistors are grounded, but may be biased to a negative voltage instead. A voltage ranging from the voltage applied to the bit lines (i.e., 0V or a negative voltage) to a programming inhibiting voltage, such as a 5V inhibiting voltage, is applied to unselected word lines 112, 113 of the fourth subset of unselected transistors 11–14 and 21–24. Preferably, 0V is applied to these word lines 112, 113.

Figure 10:
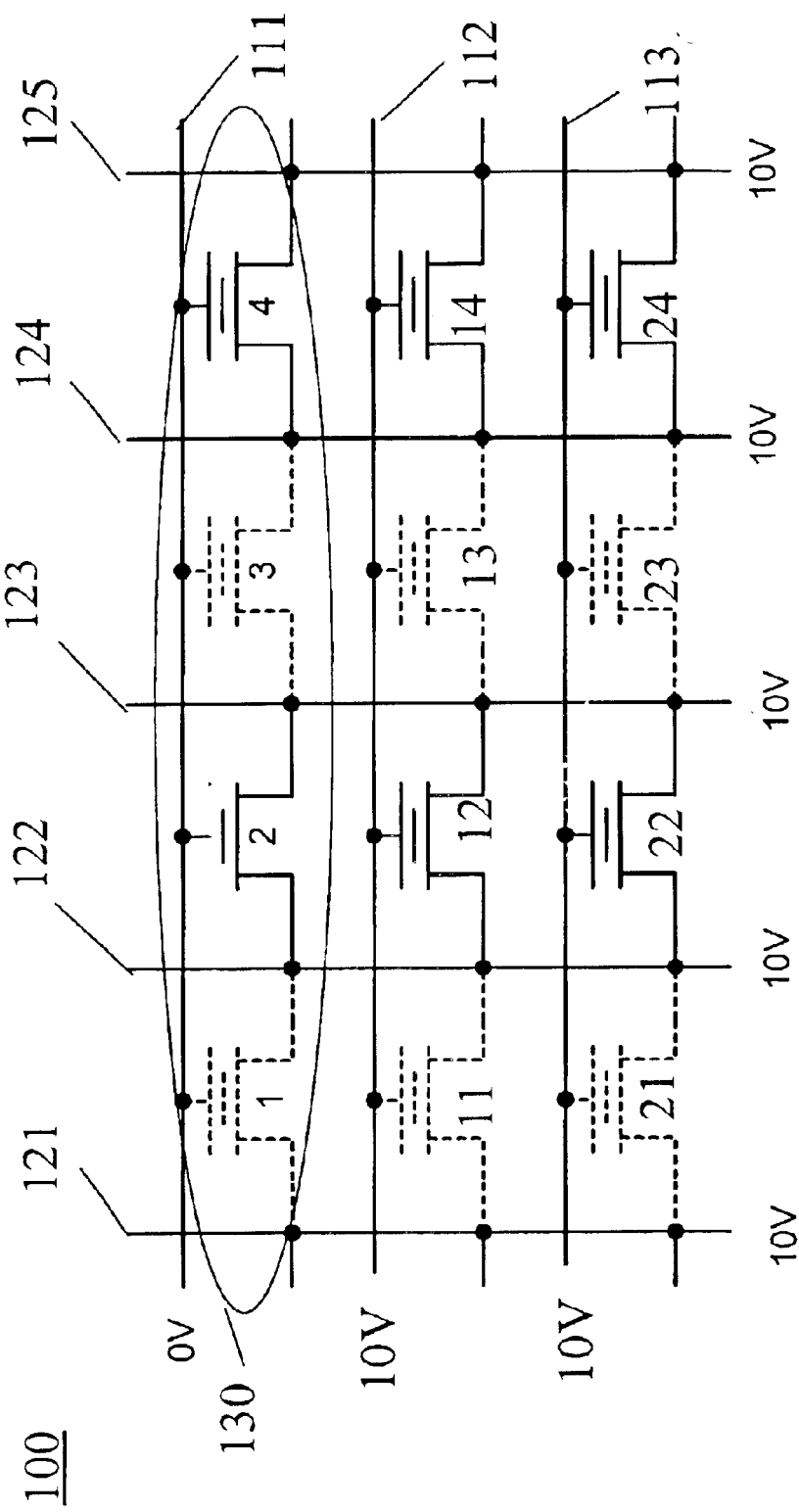

FIG. 10 illustrates a block erase operation, where the first block 130 of selected charge storage transistors 2, 4 and dummy transistors 1, 3 located in a first row of the array 100 is erased at the same time. Of course a block may also be located in more than one row. The selected first word line 111 of the first block 130 of transistors is grounded, but may be biased to a negative voltage instead. The 10V erase voltage is applied to all bit lines 121–125 of the first block 130 of transistors. A voltage ranging 0V to the erase voltage (this range includes the erase inhibiting voltage) to is applied to unselected word lines 112, 113 of a fourth subset of unselected transistors of the first set of unselected transistors 11–14 and 21–24. Preferably, an erase voltage, such as a 10V voltage, is applied to these word lines 112, 113.

The biasing conditions for the array 200 configuration of the second preferred embodiment shown in FIG. 4 will now be described. In this array 200 configuration, each charge storage transistor shares its source diffusion and its source bit line with another charge storage transistor, while it shares its drain diffusion and its drain bit line with a dummy transistor. If desired, the drain diffusion and the drain bit line may be shared between adjacent charge storage transistors and the source diffusion and the source bit line may be shared between a charge storage transistor and an adjacent dummy transistor instead. This array 200 configuration also utilizes FN tunneling for both programming and erasing.

To program a selected transistor of the array 200 using FN tunneling, a high programming voltage, VPP, is applied to the selected word line of the selected charge storage transistor. The selected bit line of the selected charge storage transistor which is shared with a dummy transistor is grounded or biased to a negative voltage. The other selected bit line of the selected charge storage transistor which is shared with an unselected charge storage transistor and all unselected bit lines are biased at the bit line programming inhibiting voltage, VPinhbtb. All unselected word lines are biased at a word line programming inhibiting voltage, VPinhbtg, so transistors on these word lines are not programmed. The magnitude of the bit line and word line programming inhibiting voltages are lower than the magnitude of the programming voltage. The magnitude of the programming inhibiting voltages are selected to inhibit programming of the unselected transistors.

Table V summarizes the biasing condition for the programming operation on the array 200. It should be noted that the voltages provided in Table V are preferred examples and should be not considered limiting on the scope of the invention.

TABLE V

| | |
|---|---|
| VGsel | VPP 10–14 V, preferably 12 V |
| VDsel | 0 V |
| VGunsel | VPinhbtg 4–6 V, preferably 5 V |
| VBunsel/VSsel | VPinhbtb 4–6 V, preferably 5 V |

Figure 11:
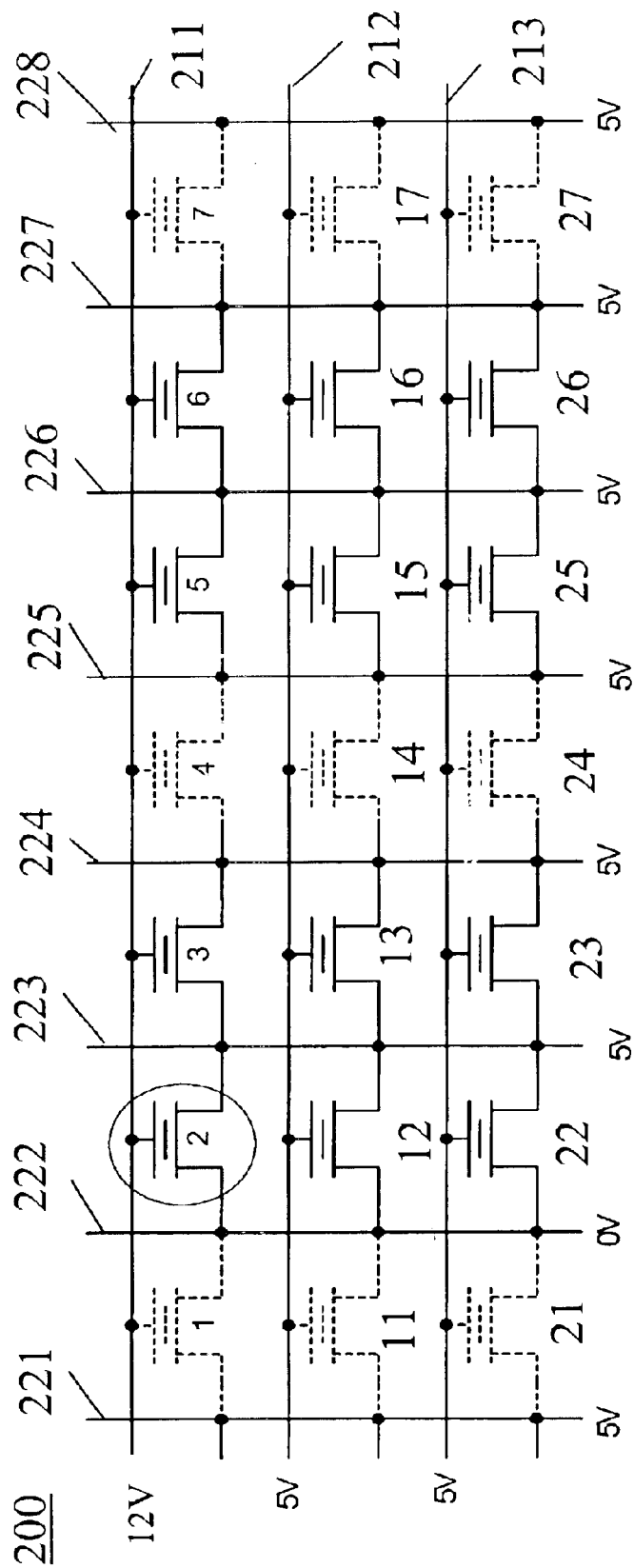

An example of programming a selected charge storage transistor 2 is illustrated in FIG. 11. The 12V programming voltage is applied to a selected first word line 211 of the selected charge storage transistor 2. The selected 222 bit line of transistor 2 is preferably grounded, but may be biased to a negative voltage instead. The selected charge storage transistor 2 shares this bit line 222 with an adjacent dummy transistor 1. The 5V programming inhibiting voltage is applied to the other selected bit line 223 as well as to unselected bit lines 221, 224–228 and to unselected word lines 212, 213 of a first set of unselected charge storage and dummy transistors 1, 3–7, 11–17 and 21–27. The selected charge storage transistor 2 shares bit line 223 with an adjacent unselected charge storage transistor 3.

In this biasing scheme, to avoid disturb on the unselected charge storage transistor 3 sharing the bit line 223 with the selected charge storage transistor 2, the shared bit line 223 is biased at VPinhbtb, while the other bit line 222 of transistor 2 is kept at ground. If desired, bit line 222 may be biased to a negative voltage instead. Thus, the FN tunneling programming of the selected transistor 2 is achieved without disturb on the neighbor charge storage transistor 3, which can be used to store data. It should be noted that current would now flow through the selected transistor 2. Thus, in the array 200 configuration, a higher device density is achieved than in the array 100 configuration. However, a higher programming power is required to program the array 200 configuration than array 100 configuration.

To erase a selected transistor of the array 200, zero volts or a negative voltage is applied to its word line (i.e., gate). A high erase voltage, VEE, is applied to the bit line of the selected charge storage transistor which is shared with a dummy transistor. A bit line erase inhibiting voltage, VEinhbtb, is applied to the bit line of the selected charge storage transistor which is shared with an unselected charge storage transistor and to the bit lines of the unselected transistors. The bit line erase inhibiting voltage is lower than the erase voltage. The magnitude of the bit line erase inhibiting voltage is selected to inhibit erasing of at least the unselected charge storage transistors. All word lines except for the selected word line of the selected transistor are biased at the word line erase inhibiting voltage, VEinhbtg.

Table VI summarizes the biasing condition for the erase operation on the array 200. It should be noted that the voltages provided in Table VI are preferred examples and should be not considered limiting on the scope of the invention.

TABLE VI

| | |
|---|---|
| VGsel | 0 V |
| VDsel | VEE 8–12 V, preferably 10 V |
| VGunsel | VEinhbtg 4–6 V, preferably 5 V |
| VBunsel/VSsel | VEinhbtb 4–6 V, preferably 5 V |

Figure 12:
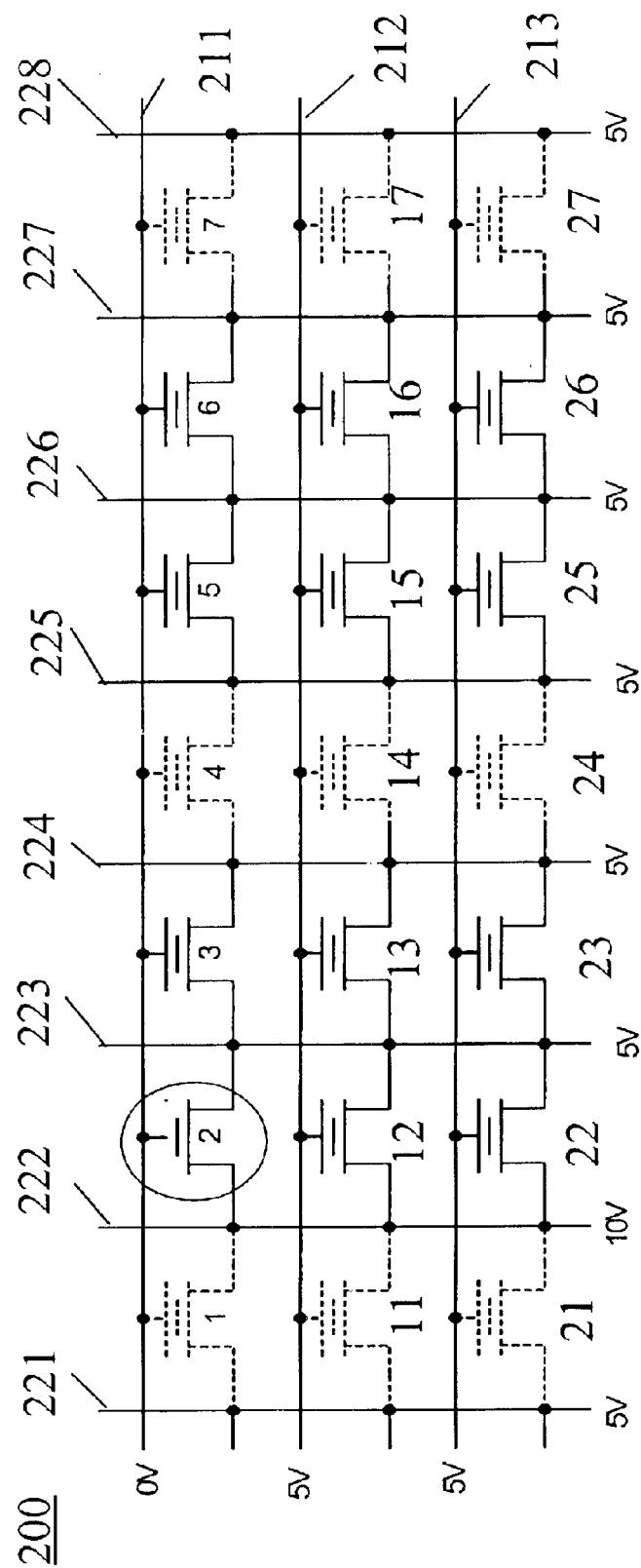

An example of erasing a selected charge storage transistor 2 is illustrated in FIG. 12. The selected first word line 211 of the selected charge storage transistor 2 is preferably grounded, but may be biased to a negative voltage instead. The 10V erase voltage is applied to the selected bit line 222 which the selected charge storage transistor 2 shares with an adjacent dummy transistor 1. The 5V erase inhibiting voltage is applied to the the to the other selected bit line 223 which the selected charge storage transistor 2 shares with an adjacent unselected charge storage transistor 3, as well as to unselected word lines 212, 213 and to the unselected bit lines 221, 224–228 of the first set of unselected charge storage and dummy transistors 1, 3–7, 11–17 and 21–27. In this biasing scheme, an inhibiting voltage is applied to the bit line 223 which is shared by the selected transistor 2 and the unselected transistor 3 to avoid disturb on the unselected transistor 3.

To read the selected transistor of array 200, the word line of the selected transistor is raised to an appropriate gate read voltage, VRDG, while the selected transistor drain and source bit lines are biased to drain and source read voltages, VRDD and VRDS, respectively. The exact values of these voltages depend on the device characteristics and their statistical distribution. Preferably, VRDG is about 2–3V, VRDD is about 2V and VRDS is about 0.5V. Thus, the VRDS magnitude is different than that of VRDD.

The read operation is performed by sensing a current on the drain or the source terminal of the selected transistor. Preferably, the reading operation is conducted from the selected bit line being shared between the selected charge storage transistor and a dummy transistor. All unselected word lines are preferably grounded, but may be biased to a small reference voltage instead. If the selected charge storage transistor is read by measuring the current on the selected source bit line, then at least one unselected bit line located adjacent to the selected source bit line of the selected charge storage transistor is precharged to the source read voltage, VRDS, before the reading operation. Alternatively, if the selected charge storage transistor is read by measuring the current on the selected drain bit line, then at least one unselected bit line located adjacent to the selected drain bit line of the selected charge storage transistor is precharged to the drain read voltage, VRDD, before the reading operation. Thus, at least the nearest unselected bit line to the selected source or drain bit line which will be read is precharged to VRDS or VRDD, respectively. Alternatively, if the selected charge storage transistor is read from the selected drain bit line, then all unselected bit lines or at least all unselected bit lines on the side of the selected drain bit line are precharged to VRDD. Alternatively, if the selected charge storage transistor is read from the selected source bit line, then all unselected bit lines or at least all unselected bit lines on the side of the selected source bit line are precharged to VRDS. The unselected precharged bit line(s) are maintained at VRDD (or VRDS if the selected source bit line is read) during the read operation or are allowed to float during the read operation.

Table VII summarizes the biasing condition for the read operation on the array 200. It should be noted that the voltages provided in Table VII are preferred examples and should be not considered limiting on the scope of the invention.

TABLE VII

| | |
|---|---|
| VGsel | VRDG |
| VSsel/VDsel | VRDS/VRDD |
| VGunsel | 0 V |
| VBunsel | Precharge to VRDD and/or VRDS and/or Float |

Figure 13:
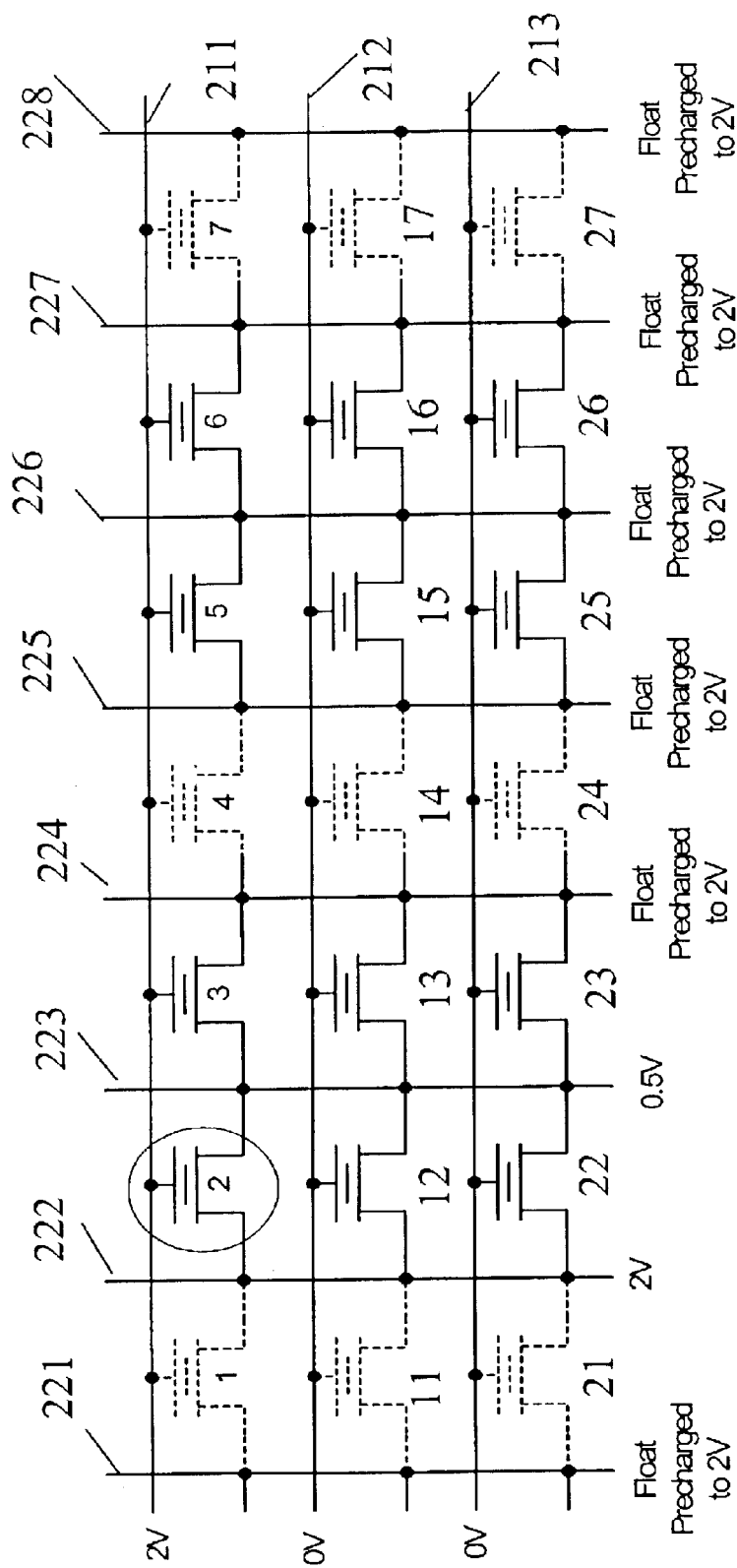

An example of reading a selected charge storage transistor 2 is illustrated in FIG. 13. Unselected bit lines 221, 224–227 of the first set of unselected transistors 1, 3–7, 11–17 and 21–27 are precharged to the 2V drain read voltage. The 2V gate read voltage is applied to the selected first word line 211 of the selected charge storage transistor 2. The gate read voltage is lower than the programming voltage.

The 2V drain read voltage is applied to the selected drain bit line 222 of the selected charge storage transistor 2. The 0.5V source read voltage is applied to the selected source bit line 223 of the selected charge storage transistor 2.

The selected charge storage transistor 2 shares a word line 211 and source bit line 223 with an unselected charge storage transistor 3.

In the preferred aspect of the second embodiment illustrated in FIG. 13, the selected charge storage transistor 2 is read by measuring a current on the selected bit line 222 which the selected charge storage transistor 2 shares with a dummy transistor. In this preferred aspect of the invention, bit line 222 functions as a drain bit line of transistor 2. In this case, at least the unselected bit line 221 is precharged to VRDD (i.e., 2V). Preferably, all unselected bit lines 221, 224–228 are precharged to VRDD. During the step of reading, the unselected bit lines 221, 224–228 may be allowed to float. Alternatively, the unselected bit lines 221, 224–228 are maintained at the 2V drain read voltage during the reading the selected charge storage transistor 2. The plurality of dummy transistors 1, 4, 7, 11, 14, 17, 21, 24 and 27 are not read during the step of reading the selected charge storage transistor 2. In alternative aspects of the second preferred embodiment, transistor 2 is read from bit line 222 when it functions as a source line or the transistor 2 is read from bit line 223 when it functions as a source or as a drain bit line. For example, if it is desired to read transistor 2 from bit line 223, then bit line 222 may be used as a source bit line and bit line 223 is used as a drain bit line. At least the unselected bit line 221 located adjacent to the selected source bit line 222 is precharged to VDDS.

Figure 14:
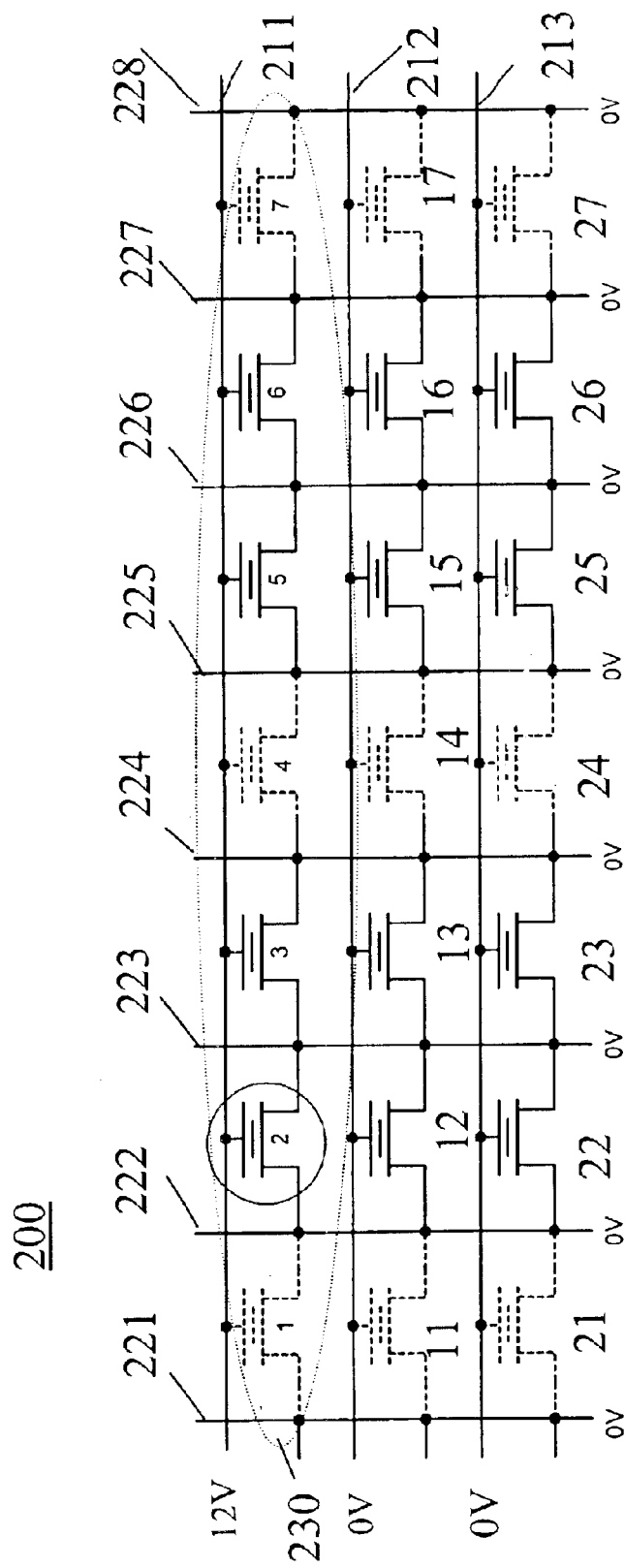

FIG. 14 illustrates a block programming operation, where a second block 230 of selected charge storage transistors 2, 3, 5, 6 and dummy transistors 1, 4, 7 located in a first row of the array 200 is programmed at the same time. Of course a block may be located in more than one row. The 12V programming voltage is applied to the selected first word line 211 of the second block 230 of selected charge storage and dummy transistors. All bit lines 221–228 of the second block 230 of transistors are preferably grounded, but may be biased to a negative voltage instead. A voltage ranging from the voltage applied to the bit lines (i.e., 0V or a negative voltage) to a programming inhibiting voltage, such as a 5V inhibiting voltage is applied to unselected word lines 212, 213 of the fourth subset of unselected transistors 11–17 and 21–27. Preferably, 0V is applied to these unselected word lines 212, 213.

Figure 15:
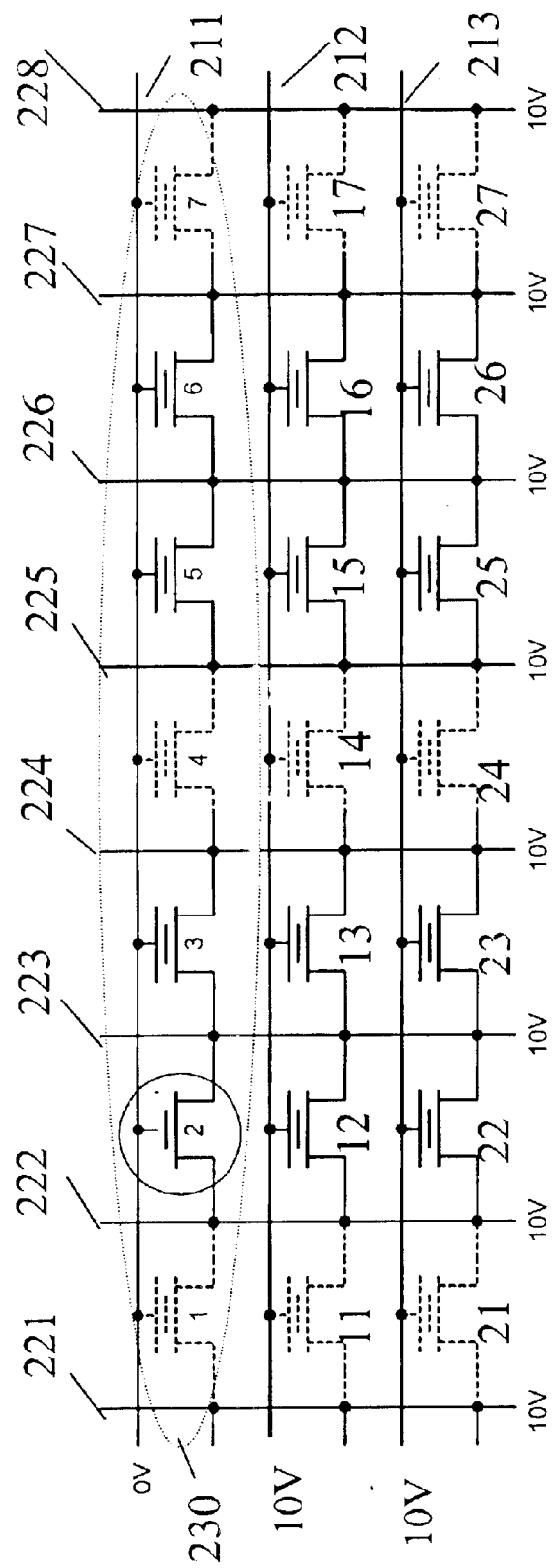

FIG. 15 illustrates a block erase operation, where the second block 230 of selected charge storage transistors 2, 3, 5, 6 and dummy transistors 1, 4, 7 located in a first row of the array 200 is erased at the same time. Of course a block may be located in more than one row. The selected first word line 211 of the second block 230 of transistors is preferably grounded, but may be biased to a negative voltage instead. The 10V erase voltage is applied to all bit lines 221–228 of the second block 230 of transistors. A voltage ranging from 0V to the erase voltage (i.e., 10V) is applied to unselected word lines 212, 213 of a fourth subset of unselected transistors 11–27 and 21–27. Preferably, the erase voltage is also applied to these unselected word lines 212, 213.

Figure 16:
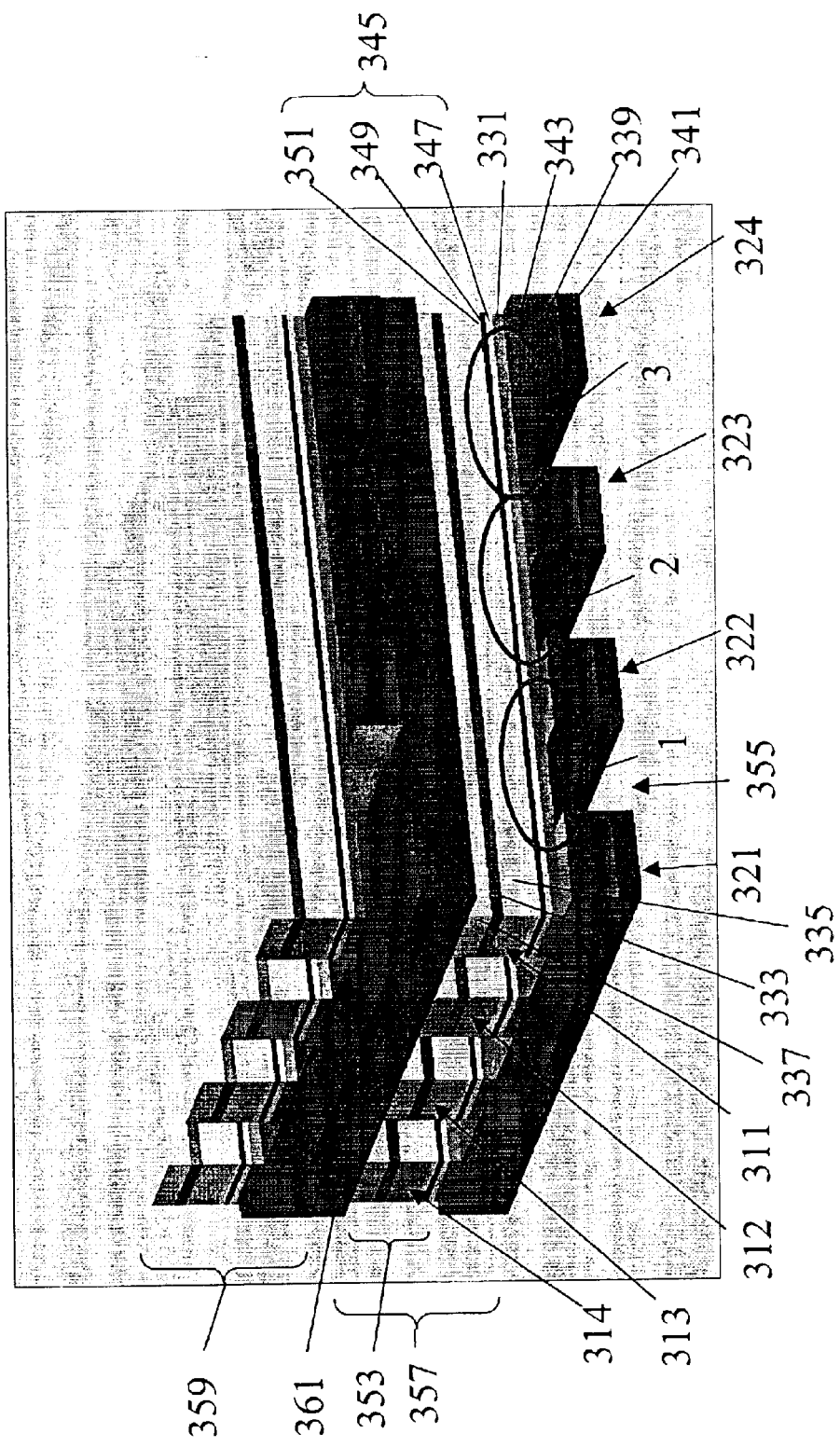
FIG. 16 is three dimensional view of an array according to the preferred embodiments of the present invention.

The arrays 100, 200 may have any suitable structure and layout. Preferably, while the biasing circuit schematics for array 100 and 200 configurations are different, the actual physical structure and layout for the arrays 100, 200 is the same. FIG. 16 illustrates an array 100, 200 of transistors according to the preferred aspect of the preferred embodiments of the present invention. The array 100, 200 of FIG. 16 may be biased according to the methods of the first and/or the second preferred embodiments.

The array 100, 200 is illustrated in FIG. 16 as a monolithic three dimensional array of thin film transistors. However, the array 100, 200 may comprise a two dimensional array (i.e., an array containing only one vertical device level) of any suitable transistors, such as thin film transistors or field effect transistors located in a semiconductor substrate.

The array 100, 200 includes a plurality of transistors. For example, three transistors 1, 2 and 3 are illustrated in FIG. 16. It should be understood that the array 100, 200 contains more than three transistors. In the array 100 configuration of the first preferred embodiment, transistors 1 and 3 are dummy transistors and transistor 2 is a charge storage transistor. In the array 200 configuration of the second preferred embodiment, transistor 1 is a dummy transistor and transistors 2 and 3 are charge storage transistors.

The array 100, 200 contains a plurality of word lines 311, 312, 313, 314 extending in a first direction (for example, left to right in FIG. 16). The array also contains a plurality of bit lines 321, 322, 323, 324 extending in a generally orthogonal second direction (for example, in and out of the page in FIG. 16).

The adjacent transistors of the array 100, 200 share a common source/drain region and a common bit line. If the transistors 1, 2 and 3 comprise thin film transistors, then the semiconductor active region comprises a semiconductor layer 331, such as a polysilicon layer or an amorphous silicon layer, located over an insulating layer or substrate. If desired, a portion of the semiconductor active region may extend into the bit lines 321–324 if the bit lines contain a semiconductor material, such as heavily doped polysilicon. Thus, the common source/drains may be located entirely or partially in the portions of the bit lines underlying each respective transistor. Alternatively, a portion or the entire volume of the common source/drains may be located in the semiconductor layer 331, with the common source/drains being heavily doped regions of the opposite conductivity type to the doping of the semiconductor layer 331. If the transistors 1, 2 and 3 comprise field effect transistors located in a single crystal semiconductor substrate, then the semiconductor active region comprises a portion of the single crystal semiconductor substrate, such as a silicon substrate, or an epitaxial silicon layer located on the single crystal silicon substrate.

Any suitable materials may be used to form the transistors of the array 100, 200. The word lines 311–314 and the bit lines 321–324 may comprise any one or more conductive materials suitable for use as electrodes of semiconductor devices. Preferably, the word lines 311–314 include a metal silicide layer or region 333 located between two heavily doped polysilicon layers or regions 335, 337, as shown in FIG. 16. The bit lines 321–324 also preferably include a metal silicide layer or region 339 located between two heavily doped polysilicon layers or regions 341, 343, as shown in FIG. 16.

The transistors 1, 2 and 3 of the array also contain a charge storage region 345. The charge storage region may comprise a dielectric isolated floating gate, an oxide-nitride-oxide (ONO) film, or other charge storage materials. Preferably, the charge storage region 345 includes an ONO film comprising a silicon dioxide tunneling dielectric layer 347, a silicon nitride charge storage dielectric layer 349 and a silicon dioxide blocking dielectric layer 351. However, other materials may be used instead. For example, one or both of the tunneling dielectric 347 and the blocking dielectric 351 may comprise a metal oxide layer, such as $Al_2O_3$, $Ta_2O_5$, $Y_2O_3$, CaO, MgO or $ZrO_2$. The charge storage dielectric 349 may comprise silicon oxynitride, an insulating material (such as silicon dioxide) containing metal nanocrystals, an insulating material (such as silicon dioxide) containing hydrogen ions, a metal oxide material or layer, such as $Ta_2O_5$, $ZrO_2$ or $HfO_2$, or a polysilicon floating gate.

The array 100, 200 may have any suitable layout. Preferably, at least a portion of the semiconductor active layer 331, the tunneling dielectric 347, the charge storage dielectric 349, the blocking dielectric 351 and a first common word line 311 are located in one of a plurality of rail stacks 353 extending in the first direction, as shown in FIG. 16. Each rail stack is patterned using the same mask during the same etching step, as will be described in more detail below, such that it has planar, aligned sidewalls. As shown in FIG. 16, the array 100, 200 includes a plurality of rail stacks extending the same direction and a plurality of bit lines 321–324 extending in a generally orthogonal direction. Preferably, an insulating fill material 355, such as silicon dioxide, spin-on glass or borophosphosilicate glass (BPSG) is located between adjacent rail stacks and between adjacent bit lines, as shown in FIG. 16.

In a preferred aspect of the invention, the array 100, 200 comprises a monolithic, three dimensional array of thin film transistors formed above a substrate (not shown for clarity), as illustrated in FIG. 16. The thin film transistors are located in a plurality of device levels 357, 359. A device level is monolithically formed over a lower device level when it is deposited on the lower device level layer by layer, instead of the entire upper device level being formed separately and then glued or bonded to the lower device layer. The device levels 357, 359 are separated from each other by an insulating layer 359. While only two device levels are shown in FIG. 16 for ease of illustration, a suitable number of additional device levels having a similar configuration to the device levels 357, 359 may be monolithically formed over the second device level 359. For example, two to six additional device levels may be formed over the second device level 359.

In the preferred aspect of the preferred embodiments illustrated in FIG. 16, both the first 357 and the second 359 device levels contain identical top gate staggered transistors. The effective cell size of the array 100 configuration is about $8f^2/N$, where f is the minimum feature size (i.e. 0.18 microns in a 0.18 micron semiconductor process) and N is number of device levels. The term "about" allows for small deviations (10% or less) due to non-uniform process conditions and other small deviations from desired process parameters. The effective cell size of the array 200 configuration is about $6f^2/N$ because it contains less dummy transistors. Thus, for a four level array, the effective cell size is about 1.5 to about $2f^2$.

The array 100, 200 is not limited to the layout shown in FIG. 16. For example, the array may comprise a plurality of bottom gate thin film transistors instead of top gate thin film transistors. Thus, the array structure shown in FIG. 16 would be turned up-side down, with the bit lines being located above the active region of a transistor. Alternatively, the array 100, 200 may contain both top gate and bottom gate thin film transistors in a "mirrored" configuration. This layout is advantageous because it allows the effective cell size to be decreased. The top gate transistor and bottom gate transistor device levels alternate, with the bottom gate transistors sharing word lines with underlying top gate transistors and sharing bit lines with overlying top gate transistors.

The present invention is not limited to the arrays 100, 200 configuration shown in the FIG. 16. Other array configurations, such as those described in U.S. published application 20020028541, incorporated herein by reference, may be used instead.

The arrays 100, 200 of the preferred embodiments of the present invention may be made by any suitable method. Each layer of the transistors may be deposited over the substrate by any suitable method, such as chemical vapor deposition (CVD), atomic layer deposition (ALD) or physical vapor deposition (PVD), such as sputtering, methods. Insulating layers may also be thermally grown on silicon where a silicon surface is available. The layers may be patterned by any suitable technique, such as photolithographic masking and etching. Source and drain regions may be formed by ion implantation of dopants of a first conductivity type into the active layer of a second conductivity type or by outdiffusing dopants of a first conductivity type from polysilicon bit lines into the active layer of a second conductivity type.

To form the arrays 100, 200 of the preferred embodiments, the bit lines 321–324 are formed over the substrate. The bit lines may be formed by forming one or more conductive layers, such as a metal silicide layer between two heavily doped polysilicon layers, and forming a first photolithographic mask, such as a photoresist mask, over the conductive layers. The conductive layers are then etched using the first mask to form the bit lines 321–324. Thus, the bit lines for the dummy and the charge storage transistors are made during the same photolithographic masking step.

The first mask may be formed such that the spacing between the bit lines of the dummy transistors is the same as the spacing between the bit lines of the charge storage transistors. Alternatively, the first mask may be formed such that the spacing between the bit lines of the dummy transistors is different from the spacing between the bit lines of the charge storage transistors. In this case, the dummy transistors will have different dimensions (i.e., a different source to drain spacing) than the charge storage transistors, even though the dummy and the charge storage transistors are made during the same photolithographic masking step.

An insulating fill material, such as silicon dioxide, is deposited between and over the patterned bit lines and planarized with the top of the bit lines by chemical mechanical polishing or etch back to form an insulating fill 355, as shown in FIG. 16. An active polysilicon layer 331 is deposited on the bit lines 321–324 and on the fill 355. The polysilicon layer 331 may be deposited as an amorphous silicon layer and then recrystallized into the polysilicon layer. The polysilicon layer 331 has an opposite conductivity type (i.e., p-type or n-type) to the conductivity type (i.e., n-type or p-type) of polysilicon layers 343, 341 of the bit lines.

The tunneling dielectric layer 347, such as a silicon dioxide layer, is then deposited or thermally grown on the active layer 331. A charge storage dielectric layer 349 is formed over the active layer 331 and on the tunneling dielectric layer 347. Preferably, the tunneling dielectric layer comprises a silicon nitride layer. The blocking dielectric layer 351 is formed on the charge storage dielectric layer 349. A word line film is then formed on the blocking dielectric 351. The word line film may comprise a metal silicide layer 333 located between two polysilicon layers 335, 337. The word line film is then patterned into a plurality of word lines 311–314 as shown in FIG. 16, using a second photolithographic mask formed on the word line film. Preferably, the word line film, the blocking dielectric layer, the charge storage dielectric layer, the tunneling dielectric layer and the polysilicon active layer are etched together using the same second mask to form the plurality of rail stacks 353 extending generally orthogonal to the bit lines 321–324. Thus, the upper dummy and the charge storage transistor portions are formed during the same photolithographic masking step.

If it is desired to form sources and drains in the polysilicon active layer 331 rather than just in portions of the bit lines, then an annealing step is performed to outdiffuse source and drain dopants from the heavily doped polysilicon layer 343 in bit lines into the polysilicon active layer 331 to form at least portions of sources and drains in the polysilicon active layer.

If bottom gate thin film transistors are formed, then the order of steps described above is reversed. The word line film is formed first, then the blocking dielectric layer is formed on the word line film, the charge storage dielectric layer is formed on the blocking dielectric layer, and the tunneling dielectric layer is formed on the charge storage dielectric layer. A polysilicon active layer is then formed on the tunneling dielectric.

A mask is formed over the polysilicon active layer. The polysilicon active layer, the blocking dielectric, the charge storage dielectric layer, the tunneling dielectric and the word line film are patterned using the mask to form a plurality of rail stacks. A first insulating fill is formed between the rail stacks. At least portions of sources and drains are formed in the polysilicon active layer, by a method such as ion implantation. A plurality of bit lines are then formed on the polysilicon active layer and on the first insulating fill, and a second insulating fill is formed between the bit lines.

Preferably, the arrays 100, 200 are formed as a monolithic three dimensional array of device levels, as illustrated in FIG. 16. In this case, the method further comprises monolithically forming a plurality of thin film transistors in a plurality of vertically stacked device levels.

The foregoing description of the invention has been presented for purposes of illustration and description. It is not intended to be exhaustive or to limit the invention to the precise form disclosed, and modifications and variations are possible in light of the above teachings or may be acquired from practice of the invention. The drawings and description were chosen in order to explain the principles of the invention and its practical application. The drawings are not necessarily to scale and illustrate the array in schematic block format. It is intended that the scope of the invention be defined by the claims appended hereto, and their equivalents.

What is claimed is:

1. A method of operating an array of transistors, comprising:
   (a) providing the array of transistors, comprising:
      a plurality of charge storage transistors; and
      a plurality of dummy transistors interspersed with the plurality of charge storage transistors;
      wherein each of the plurality of the dummy transistors is made using same photolithographic masking steps as each of the plurality of the charge storage transistors;
   (b) performing at least one of programming and erasing the array of transistors; and
   (c) reading the plurality of charge storage transistors but not the plurality of dummy transistors of the array of transistors.

2. The method of claim 1, wherein:
the array of transistors comprises a plurality of columns of transistors;
the plurality of charge storage transistors are located in a first group of columns of the plurality of columns;
the plurality of dummy transistors are located in a second group of columns of the plurality of columns; and
the step of reading comprises reading the first group of columns and not reading the second group of columns.

3. The method of claim 2, wherein:
the plurality of charge storage transistors are located in a first out of every two columns of the plurality of columns; and
the plurality of dummy transistors are located in a second out of every two columns of the plurality of columns.

4. The method of claim 2, wherein:
the plurality of charge storage transistors are located in first and second columns out of every three columns of the plurality of columns; and
the plurality of dummy transistors are located in a third out of every three columns of the plurality of columns.

5. The method of claim 1, wherein the step of performing at least one of programming and erasing the array of transistors comprises simultaneously programming a first block of transistors, and the first block of transistors comprises:
a first number of charge storage transistors of the plurality of charge storage transistors; and
a second number of dummy transistors of the plurality of dummy transistors.

6. The method of claim 5, further comprising selectively erasing at least some of the first number of charge storage transistors located in the first block of transistors, wherein during the step of selectively erasing, the second number of dummy transistors are either erased or not erased.

7. The method of claim 1, wherein the step of performing at least one of programming and erasing the array of transistors comprises simultaneously erasing a first block of transistors, wherein the first block of transistors comprises:
a first number of charge storage transistors of the plurality of charge storage transistors; and
a second number of dummy transistors of the plurality of dummy transistors.

8. The method of claim 7, further comprising selectively programming at least some of the first number of charge storage transistors located in the first block of transistors, wherein during the step of selectively programming, the second number of dummy transistors are either programmed or not programmed.

9. The method of claim 1, wherein:
the step of performing at least one of programming and erasing the array of transistors comprises selectively programming the plurality of charge storage transistors; and
during the step of selectively programming, the plurality of dummy transistors are either programmed or not programmed.

10. The method of claim 1, wherein:
the step of performing at least one of programming and erasing the array of transistors comprises selectively erasing the plurality of charge storage transistor; and during the step of selectively erasing, the plurality of dummy transistors are either erased or not erased.

11. The method of claim 1, wherein:
the step of performing at least one of programming and erasing the array of transistors comprises selectively programming and selectively erasing the plurality of charge storage transistors; and
during the steps of selectively programming and selectively erasing, the plurality of dummy transistors are either affected or not affected by the selective programming and the selective erasing steps.

12. The method of claim 1, wherein:
the step of performing at least one of programming and erasing the array of transistors comprises programming or erasing the array once by FN tunneling, or programming and erasing the array a plurality of times by FN tunneling.

13. The method of claim 1, wherein:
the plurality of charge storage transistors comprise a plurality of dedicated charge storage transistors; and
the plurality of dummy transistors comprise a plurality of dedicated dummy transistors.

14. The method of claim 1, wherein each dummy transistor has an identical structure to each charge storage transistor.

15. The method of claim 1, wherein each dummy transistor has different dimensions than each charge storage transistor.

16. The method of claim 1, wherein:
the array of transistors comprises a monolithic three dimensional array of thin film transistors;
the thin film transistors are located in a plurality of device levels; and
the thin film transistors are selected from a group consisting of top gate thin film transistors, bottom gate thin film transistors and a combination of top and bottom gate thin film transistors.

17. A semiconductor device, comprising:
(a) an array of transistors comprising:
(i) a plurality of charge storage transistors; and
(ii) a plurality of dummy transistors interspersed with the plurality of charge storage transistors, wherein each of the plurality of the dummy transistors is made using same photolithographic masking steps as each of the plurality of the charge storage transistors; and
(b) a first means for:
(i) performing at least one of programming and erasing the array of transistors; and
(ii) reading the plurality of charge storage transistors but not the plurality of dummy transistors of the array of transistors.

18. The device of claim 17, wherein:
the array of transistors comprises a plurality of columns of transistors;
the plurality of charge storage transistors are located in a first group of columns of the plurality of columns;
the plurality of dummy transistors are located in a second group of columns of the plurality of columns; and
the first means comprises a means for reading the first group of columns and for not reading the second group of columns.

19. The device of claim 18, wherein:
the plurality of charge storage transistors are located in a first out of every two columns of the plurality of columns; and the plurality of dummy transistors are located in a second out of every two columns of the plurality of columns.

20. The device of claim 18, wherein:
the plurality of charge storage transistors are located in first and second columns out of every three columns of the plurality of columns; and
the plurality of dummy transistors are located in a third out of every three columns of the plurality of columns.

21. The device of claim 17, wherein the first means for performing at least one of programming and erasing the array of transistors comprises a means for simultaneously programming a first block of transistors, and the first block of transistors comprises:
a first number of charge storage transistors of the plurality of charge storage transistors; and
a second number of dummy transistors of the plurality of dummy transistors.

22. The device of claim 21, wherein the first means further comprises a means for selectively erasing at least some of the first number of charge storage transistors located in the first block of transistors, such that during the step of selectively erasing, the second number of dummy transistors are either erased or not erased.

23. The device of claim 17, wherein the first means for performing at least one of programming and erasing the array of transistors comprises a means for simultaneously erasing a first block of transistors, wherein the first block of transistors comprises:
a first number of charge storage transistors of the plurality of charge storage transistors; and
a second number of dummy transistors of the plurality of dummy transistors.

24. The device of claim 23, wherein the first means further comprises a means for selectively programming at least some of the first number of charge storage transistors located in the first block of transistors, such that during the step of selectively programming, the second number of dummy transistors are either programmed or not programmed.

25. The device of claim 17, wherein the first means for performing at least one of programming and erasing the array of transistors comprises a means for selectively programming and for selectively erasing the plurality of charge storage transistors, such that the plurality of dummy transistors are either affected or not affected by the selective programming and the selective erasing steps.

26. The device of claim 17, wherein:
the plurality of charge storage transistors comprise a plurality of dedicated charge storage transistors; and
the plurality of dummy transistors comprise a plurality of dedicated dummy transistors.

27. The device of claim 17, wherein each dummy transistor has an identical structure to each charge storage transistor.

28. The device of claim 17, wherein each dummy transistor has different dimensions than each charge storage transistor.

29. The device of claim 17, wherein:
the array of transistors comprises a monolithic three dimensional array of thin film transistors;
the thin film transistors are located in a plurality of device levels; and
the thin film transistors are selected from a group consisting of top gate thin film transistors, bottom gate thin film transistors and a combination of top and bottom gate thin film transistors.

30. A semiconductor device, comprising:
(a) an array of transistors, comprising:
  (i) a plurality of charge storage transistors; and
  (ii) a plurality of dummy transistors interspersed with the plurality of charge storage transistors, wherein each of the plurality of the dummy transistors is made using same photolithographic masking steps as each of the plurality of the charge storage transistors; and
(b) peripheral programming circuitry operable to:
  (i) program or erase the array of transistors; and
  (ii) read the plurality of charge storage transistors but not the plurality of dummy transistors of the array of transistors.

31. The device of claim 30, wherein each dummy transistor has an identical structure to each charge storage transistor.

32. The device of claim 30, wherein each dummy transistor has different dimensions than each charge storage transistor.

33. A method of biasing an array of transistors, comprising:
(a) providing the array of transistors comprising a plurality of charge storage transistors and a plurality of dummy transistors interspersed with the plurality of charge storage transistors, wherein each of the plurality of the dummy transistors is made using same photolithographic masking steps as each of the plurality of the charge storage transistors; and
(b) reading each selected charge storage transistor of the plurality of charge storage transistors, wherein the step of reading each selected charge storage transistor comprises:
  applying a gate read voltage to a selected word line of the selected charge storage transistor, wherein the gate read voltage is lower than a programming voltage;
  applying a drain read voltage to a selected drain bit line of the selected charge storage transistor;
  applying a source read voltage to a selected source bit line of the selected charge storage transistor, wherein the source read voltage is different than the drain read voltage;
  grounding or biasing unselected word lines to a reference voltage, wherein the reference voltage is lower than a programming voltage;
  reading the selected charge storage transistor by measuring a current on the selected source bit line or the selected drain bit line of the selected charge storage transistor;
  prior to the step of reading the selected charge storage transistor,
    (i) precharging at least one unselected bit line located adjacent to the selected source bit line of the selected charge storage transistor to the source read voltage if the selected charge storage transistor is read by measuring the current on the selected source bit line; or
    (ii) precharging at least one unselected bit line located adjacent to the selected drain bit line of the selected charge storage transistor to the drain read voltage if the selected charge storage transistor is read by measuring the current on the selected drain bit line; and
  during the step of reading the selected charge storage transistor,
    (i) allowing the at least one unselected precharged bit line to float; or
    (ii) maintaining the at least one unselected precharged bit line at the source or drain read voltage;
wherein the plurality of dummy transistors are not read during the step of reading each selected charge storage transistor.

34. The method of claim 33, further comprising:
(c) programming the selected charge storage transistor by:
  applying the programming voltage to the selected word line of the selected charge storage transistor;
  grounding or biasing to a negative voltage the selected source and drain bit lines of the selected charge storage transistor; and
  applying a programming inhibiting voltage to unselected word lines and to unselected bit lines of a first set of unselected transistors, wherein a same or a different programming inhibiting voltage is applied to the unselected word lines and to the unselected bit lines;
wherein:
the first set of unselected transistors comprises unselected charge storage transistors of the plurality of charge storage transistors and unselected dummy transistors of the plurality of dummy transistors; and
a magnitude of the programming inhibiting voltage is lower than a magnitude of the programming voltage to avoid programming at least the unselected charge storage transistors of the first set of unselected transistors.

35. The method of claim 34, further comprising:
(f) erasing a first block of selected charge storage and dummy transistors located in a given row of the array by:
  grounding or biasing to a negative voltage the selected word line of the first block of selected charge storage and dummy transistors;
  applying an erase voltage to all bit lines of the first block of selected charge storage and dummy transistors; and
  applying a voltage ranging from the voltage applied to the selected word line to an erase inhibiting voltage to unselected word lines of a fourth subset of unselected transistors of the first set of unselected transistors.

36. The method of claim 33, further comprising:
(d) erasing the selected charge storage transistor by:
  grounding or biasing to a negative voltage the selected word line of the selected charge storage transistor;
  applying an erase voltage to the selected source and drain bit lines of the selected charge storage transistor; and
  applying an erase inhibiting voltage to unselected word lines and to unselected bit lines of the first set of unselected transistors, wherein a same or a different erase inhibiting voltage is applied to the unselected word lines and to the unselected bit lines;
wherein:
the first set of unselected transistors comprises unselected charge storage transistors of the plurality of charge storage transistors and unselected dummy transistors of the plurality of dummy transistors; and
a magnitude of the erase inhibiting voltage is lower than a magnitude of the erase voltage to avoid erasing at least the unselected charge storage transistors of the first set of unselected transistors.

37. The method of claim 36, further comprising:
(e) programming a first block of selected charge storage and dummy transistors located in a given row of the array by:

applying the programming voltage to the selected word line of the first block of selected charge storage and dummy transistors;

grounding or biasing to a negative voltage all bit lines of the first block of selected charge storage and dummy transistors; and applying a voltage ranging from the voltage applied to all the bit lines of the first block to a programming inhibiting voltage to unselected word lines of the fourth subset of unselected transistors.

38. The method of claim 33, wherein:

the plurality of dummy transistors and the plurality of charge storage transistors comprise thin film transistors containing a charge storage region;

each of the plurality of charge storage transistors is located between two of the plurality of dummy transistors; and each of the plurality of charge storage transistors shares one bit line with one of the two dummy transistors and shares another bit line with another one of the two dummy transistors.

39. The method of claim 38, wherein:

the array comprises a monolithic three dimensional array of thin film transistors;

the thin film transistors are located in a plurality of device levels; and the thin film transistors are selected from a group consisting of top gate thin film transistors, bottom gate thin film transistors and a combination of top and bottom gate thin film transistors.

40. The method of claim 33, further comprising:

(c) programming the selected charge storage transistor by:

applying the programming voltage to a selected word line of the selected charge storage transistor;

grounding or biasing to a negative voltage a first selected bit line that the selected charge storage transistor shares with an adjacent dummy transistor, wherein the first selected bit line comprises one of the selected source bit line and the selected drain bit line;

applying a programming inhibiting voltage to a second selected bit line that the selected charge storage transistor shares with an adjacent unselected charge storage transistor, wherein the second selected bit line comprises another one of the selected source bit line and the selected drain bit line; and applying the programming inhibiting voltage to unselected word lines and to unselected bit lines of a first set of unselected transistors, wherein a same or a different programming inhibiting voltage is applied to the unselected word lines, to the unselected bit lines, and to the second selected bit line;

wherein:

the first set of unselected transistors comprises unselected charge storage transistors of the plurality of charge storage transistors and unselected dummy transistors of the plurality of charge storage transistors; and a magnitude of the programming inhibiting voltage is lower than a magnitude of the programming voltage to avoid programming at least the unselected charge storage transistors of the first set of unselected transistors.

41. The method of claim 33, further comprising:

(d) erasing the selected charge storage transistor by:

grounding or biasing to a negative voltage the selected first word line of the selected charge storage transistor;

applying an erase voltage to a first selected bit line that the selected charge storage transistor shares with an adjacent dummy transistor, wherein the first selected bit line comprises one of the selected source bit line and the selected drain bit line;

applying an erase inhibiting voltage to a second selected bit line that the selected charge storage transistor shares with an adjacent unselected charge storage transistor, wherein the first selected bit line comprises another one of the selected source bit line and the selected drain bit line; and applying the erase inhibiting voltage to the unselected word lines and to the unselected bit lines of the first set of unselected transistors, wherein a same or a different erase inhibiting voltage is applied to the unselected word lines, to the second selected bit line and to the unselected bit lines;

wherein:

the first set of unselected transistors comprises unselected charge storage transistors of the plurality of charge storage transistors and unselected dummy transistors of the plurality of charge storage transistors; and a magnitude of the erase inhibiting voltage is lower than a magnitude of the erase voltage to avoid erasing at least the unselected charge storage transistors in the first set of unselected transistors.

42. The method of claim 33, wherein:

the plurality of dummy transistors and the plurality of charge storage transistors comprise thin film transistors containing a charge storage region; and each of the plurality of dummy transistors is located between two of the plurality of charge storage transistors.

43. The method of claim 42, wherein:

the array comprises a monolithic three dimensional array of thin film transistors;

the thin film transistors are located in a plurality of device levels; and the thin film transistors are selected from a group consisting of top gate thin film transistors, bottom gate thin film transistors and a combination of top and bottom gate thin film transistors.

* * * * *